United States Patent
Baek et al.

(10) Patent No.: US 11,464,109 B2
(45) Date of Patent: Oct. 4, 2022

(54) PRINTED CIRCUIT BOARD INCLUDING COAXIAL PLATED THROUGH HOLE AND ELECTRONIC APPARATUS INCLUDING SAME IN WIRELESS COMMUNICATION SYSTEM

(71) Applicant: Samsung Electronics Co., Ltd., Suwon-si (KR)

(72) Inventors: Kwanghyun Baek, Suwon-si (KR); Juneseok Lee, Suwon-si (KR); Dohyuk Ha, Suwon-si (KR); Youngju Lee, Suwon-si (KR); Jinsu Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 151 days.

(21) Appl. No.: 16/876,501

(22) Filed: May 18, 2020

(65) Prior Publication Data

US 2020/0367359 A1    Nov. 19, 2020

Related U.S. Application Data

(60) Provisional application No. 62/848,708, filed on May 16, 2019.

(51) Int. Cl.
*H05K 1/02*    (2006.01)
*H05K 1/11*    (2006.01)
*H04M 1/02*    (2006.01)

(52) U.S. Cl.
CPC .......... *H05K 1/115* (2013.01); *H04M 1/0277* (2013.01); *H05K 1/0243* (2013.01);
(Continued)

(58) Field of Classification Search
CPC ................. H05K 1/115; H05K 1/0243; H05K 2201/10098; H05K 2201/10545;
(Continued)

(56) References Cited

U.S. PATENT DOCUMENTS

2005/0030231 A1   2/2005  Nagaishi et al.
2007/0124930 A1   6/2007  Cheng et al.
(Continued)

FOREIGN PATENT DOCUMENTS

JP    2001-196745 A    7/2001
JP    2002-217541 A    8/2002
(Continued)

OTHER PUBLICATIONS

International Search Report dated Aug. 21, 2020, issued in International Application No. PCT/KR2020/006488.
(Continued)

*Primary Examiner* — Steven T Sawyer
(74) *Attorney, Agent, or Firm* — Jefferson IP Law, LLP

(57) ABSTRACT

The disclosure relates to a communication method and system for converging a 5th-Generation (5G) communication system for supporting higher data rates beyond a 4th-Generation (4G) system with a technology for Internet of Things (IoT). The disclosure may be applied to intelligent services based on the 5G communication technology and the IoT-related technology, such as smart home, smart building, smart city, smart car, connected car, health care, digital education, smart retail, security and safety services. An electronic apparatus is provided. The electronic apparatus includes a printed circuit board (PCB), an antenna module mounted on a surface of the printed circuit board, and a radio frequency integrated circuit (RFIC) module mounted on another surface of the printed circuit. The printed circuit
(Continued)

board includes a coaxial plated through-hole (PTH) electrically connected with the antenna module and the RFIC.

12 Claims, 28 Drawing Sheets

(52) U.S. Cl.
CPC . *H05K 1/0298* (2013.01); *H05K 2201/10098* (2013.01); *H05K 2201/10545* (2013.01)

(58) Field of Classification Search
CPC ...... H05K 1/141; H05K 1/181; H05K 1/0222; H05K 2201/09809; H05K 3/429; H05K 3/4623; H04M 1/0277; H01Q 1/38
See application file for complete search history.

(56) References Cited

U.S. PATENT DOCUMENTS

| | | | |
|---|---|---|---|
| 2011/0203842 A1 | 8/2011 | Russell | |
| 2012/0212384 A1* | 8/2012 | Kam | H01Q 1/2283 343/834 |
| 2014/0145883 A1* | 5/2014 | Baks | H01L 23/66 343/700 MS |
| 2015/0014045 A1 | 1/2015 | Brigham et al. | |
| 2017/0048969 A1 | 2/2017 | Qiang et al. | |
| 2018/0084637 A1* | 3/2018 | Ueda | H05K 1/0239 |
| 2018/0159203 A1* | 6/2018 | Baks | H01Q 21/065 |
| 2020/0227811 A1* | 7/2020 | Dalmia | H01Q 21/28 |

FOREIGN PATENT DOCUMENTS

| | | |
|---|---|---|
| JP | 2002-280737 A | 9/2002 |
| WO | 2019/064510 A1 | 4/2019 |

OTHER PUBLICATIONS

Extended European Search Report dated May 16, 2022, issued in European Application No. 20806733.0-1211.

* cited by examiner

PRINTED CIRCUIT BOARD INCLUDING COAXIAL PLATED THROUGH HOLE AND ELECTRONIC APPARATUS INCLUDING SAME IN WIRELESS COMMUNICATION SYSTEM

CROSS-REFERENCE TO RELATED APPLICATION(S)

This application is based on and claims priority under 35 U.S.C. § 119(e) of a U.S. provisional patent application Ser. No. 62/848,708, filed on May 16, 2019, in the U.S. Patent and Trademark Office, the disclosure of which is incorporated by reference herein in its entirety.

BACKGROUND

1. Field

The disclosure relates to an electronic apparatus. More particularly, the disclosure relates to a printed circuit board having a coaxial plated hole in a wireless communication system, and an electronic apparatus including the printed circuit board.

2. Description of Related Art

To meet the demand for wireless data traffic having increased since deployment of 4th-Generation (4G) communication systems, efforts have been made to develop an improved 5th-Generation (5G) or pre-5G communication system. Therefore, the 5G or pre-5G communication system is also called a 'Beyond 4G Network' or a 'Post Long Term Evolution (LTE) System'. The 5G communication system is considered to be implemented in higher frequency (mm-Wave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid Frequency Shift Keying (FSK) and Quadrature Amplitude Modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies, such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be as an example of convergence between the 5G technology and the IoT technology.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a plated through-hole (PTH) structure of a printed circuit board (PCB) for reducing a loss of a transmission signal, and an electronic apparatus including the PTH structure.

Additional aspects will be set forth in part in the description which follows and, in part, will be apparent from the description, or may be learned by practice of the presented embodiments.

In accordance with an aspect of the disclosure, an electronic apparatus is provided. The electronic apparatus includes a printed circuit board (PCB), an antenna module mounted on a surface of the printed circuit board, and a radio frequency integrated circuit (RFIC) module including a package and an RFIC mounted on another surface of the printed circuit. The printed circuit board includes a coaxial plated through-hole (PTH) electrically connected with the antenna module and the RFIC.

The printed circuit board includes a plurality of layers.

The printed circuit board further includes a first via hole disposed between the first layer and the second layer. An end of the first via hole is electrically connected with the antenna module. Another end of the first via hole is electrically connected with an end of a coaxial feedline.

The printed circuit board further include a first conductive line disposed in the second layer. An end of the first conductive line is electrically connected with the first via hole. Another end of the first conductive line is electrically connected with the coaxial feedline.

The coaxial plated through-hole includes a coaxial feedline and a plated region surrounding the coaxial feedline.

The printed circuit board further includes a second via hole disposed between the seventeenth layer and the eighteenth layer. An end of the second via hole is electrically connected with another end of the coaxial feedline. Another end of the second via hole is electrically connected with the RFIC.

The printed circuit board further includes a third via hole disposed between a first layer and a second layer.

The printed circuit board further includes a fourth via hole disposed between the second layer and a third layer.

An end of the third via hole is electrically connected with the first layer. Another end of the third via hole is electrically connected with an end the fourth via hole.

Another end of the fourth via hole is electrically connected with the third layer.

The printed circuit board further includes a fifth via hole disposed between the fifteenth layer and the sixteenth layer.

The printed circuit board further includes a sixth via hole disposed between the sixteenth layer and the seventeenth layer.

An end of the fifth via hole is electrically connected with the sixteenth layer. Another end of the fifth via hole is electrically connected with an end the sixth via hole.

Another end of the fourth via hole is electrically connected with the seventh layer.

The printed circuit board further includes a seventh via hole and an eighth via hole disposed between the sixteenth layer and the seventeenth layer.

The printed circuit board further includes a second conductive line disposed in the sixteenth layer.

An end of the second conductive line is electrically connected with an end of the seventh via hole. Another end of the second conductive line is electrically connected with an end of the eighth via hole.

The printed circuit board further includes a ninth via hole and a ten via hole disposed between the seventeenth layer and the eighteenth layer.

An end of the ninth via hole is electrically connected with another end of the seventh via hole. Another end of the ninth via hole may be electrically connected with the RFIC. An end of the tenth via hole may be electrically connected with another end of the eighth via hole. Another end of the tenth via hole may be electrically connected with the RFIC.

The printed circuit board further includes a plated through-hole formed through the first layer to the eighteenth layer.

In accordance with another aspect of the disclosure, an electronic apparatus is provided. The electronic apparatus includes a printed circuit board (PCB), an antenna module mounted on a surface of the printed circuit board, and a radio frequency integrated circuit (RFIC) mounted on another surface of the printed circuit board, in which the printed circuit board includes a coaxial plated through-hole (PTH) electrically connected with the antenna module and the RFIC.

In accordance with another aspect of the disclosure, an electronic apparatus is provided. The electronic apparatus includes a printed circuit board (PCB), an antenna module mounted on a surface of the printed circuit board, and a system-in-package (SiP) module including a plurality of radio frequency integrated circuits (RFIC) mounted on another surface of the printed circuit board, in which the printed circuit board includes a coaxial plated through-hole (PTH) electrically connected with the antenna module and the SiP module.

According to the disclosure, it is possible to reduce a loss of a signal when outputting a transmission signal using a printed circuit board including a coaxial plated through-hole and an electronic apparatus including the coaxial plated through-hole.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
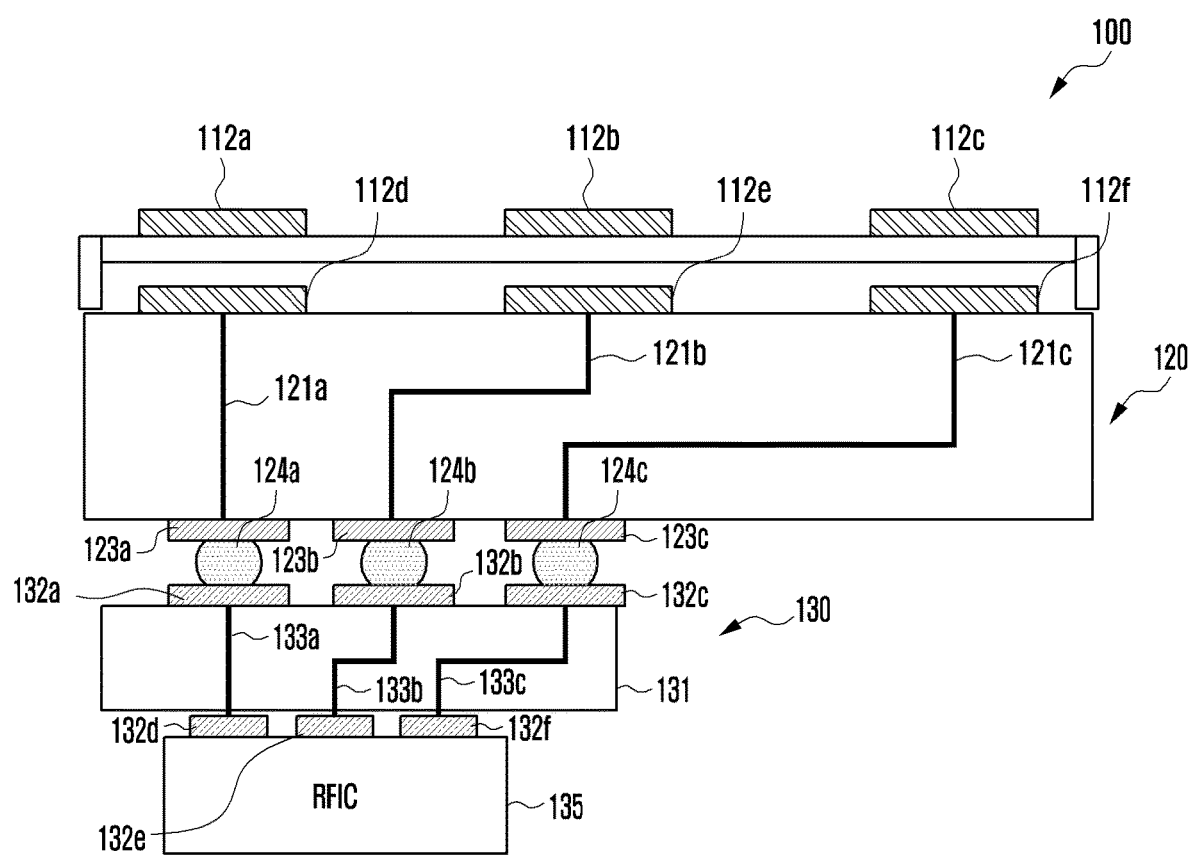
FIG. 1 is a cross-sectional view of an electronic apparatus according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

For the same reason, in the accompanying drawings, some elements may be exaggerated, omitted, or schematically illustrated. Further, the size of each element does not completely reflect the actual size. In the drawings, identical or corresponding elements are provided with identical reference numerals.

The advantages and features of the disclosure and ways to achieve them will be apparent by making reference to embodiments as described below in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Here, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the functions specified in the flowchart block or blocks.

Further, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

As used herein, the "unit" refers to a software element or a hardware element, such as a Field Programmable Gate Array (FPGA) or an Application Specific Integrated Circuit (ASIC), which performs a predetermined function. However, the "unit" does not always have a meaning limited to software or hardware. The "unit" may be constructed either to be stored in an addressable storage medium or to execute one or more processors. Therefore, the "unit" includes, for example, software elements, object-oriented software elements, class elements or task elements, processes, functions, properties, procedures, sub-routines, segments of a program code, drivers, firmware, micro-codes, circuits, data, database, data structures, tables, arrays, and parameters. The elements and functions provided by the "unit" may be either combined into a smaller number of elements, or a "unit", or divided into a larger number of elements, or a "unit". Moreover, the elements and "units" or may be implemented to reproduce one or more central processing units (CPUs) within a device or a security multimedia card. Further, the "unit" in the embodiments may include one or more processors.

FIG. 1 is a cross-sectional view of an electronic apparatus according to an embodiment of the disclosure.

Referring to FIG. 1, an electronic apparatus 100 may include an antenna module 110, a PCB 120, and an RFIC module 130. The antenna module 110, the PCB 120, and the RFIC module 130 may be electrically connected. The antenna module 110 may be mounted on a surface of the PCB 120. The RFIC module 130 may be mounted on another surface of the PCB 120. The antenna module 110 and the RFIC module 130 may be electrically connected through the PCB 120.

The antenna module 110 may include an antenna substrate 111 and a plurality of antennas 112*a* to 112*f*. For example, a first antenna to a third antenna 112*a* to 112*c* may be disposed on the top of the antenna substrate 111. The antenna substrate 111 may be disposed on the top of the PCB 120. A fourth antenna to a sixth antenna 112*d* to 112*f* may be disposed on the top of the PCB 120.

The PCB 120 may include a plurality of conductive lines 121*a* to 121*c*, a plurality of electrodes 122*a* to 122*c*, and a plurality of bump balls 123*a* to 123*c*.

An end of a first conductive line 121*a* may be connected with the fourth antenna 112*d*. Another end of the first conductive line 121*a* may be connected with a first electrode 122a. The fourth antenna 112d and the first electrode 122a may be electrically connected through the first conductive line 121a.

An end of a second conductive line 121b may be connected with the fifth antenna 112e. Another end of the second conductive line 121b may be connected with a second electrode 122b. The fifth antenna 112e and the second electrode 122b may be electrically connected through the second conductive line 121b.

An end of a third conductive line 121c may be connected with the sixth antenna 112f. Another end of the third conductive line 121c may be connected with a third electrode 122c. The sixth antenna 112f and the third electrode 122c may be electrically connected through the third conductive line 121c.

An end of a first bump ball 123a may be connected with the first electrode 122a. An end of a second bump ball 123b may be connected with the second electrode 122b. An end of a third bump ball 123c may be connected with the third electrode 122c.

The RFIC module 130 may include a package 131 and an RFIC 135. The package 131 may include a plurality of electrodes 132a to 132f and a plurality of conductive lines 133a to 133c.

A first electrode to a third electrode 132a to 132c may be disposed on a surface of the package 131. A fourth electrode to a sixth electrode 132d to 132f may be disposed on another surface of the package 131.

An end of a first conductive line 133a may be electrically connected with a first electrode 132a. Another end of the first conductive line 133a may be electrically connected with a fourth electrode 132d. An end of a second conductive line 133b may be electrically connected with a second electrode 132b. Another end of the second conductive line 133b may be electrically connected with a fifth electrode 132e. An end of a third conductive line 133c may be electrically connected with a third electrode 132c. Another end of the third conductive line 133c may be electrically connected with a sixth electrode 132f.

Another end of a fourth electrode 132d may be electrically connected with the RFIC 135. Another end of the fifth electrode 132e may be electrically connected with the RFIC 135. Another end of the sixth electrode 132f may be electrically connected with the RFIC 135.

The antenna module 110 and the PCB 120 according to an embodiment may have the structures of FIGS. 2 to 13.

Figure 2:
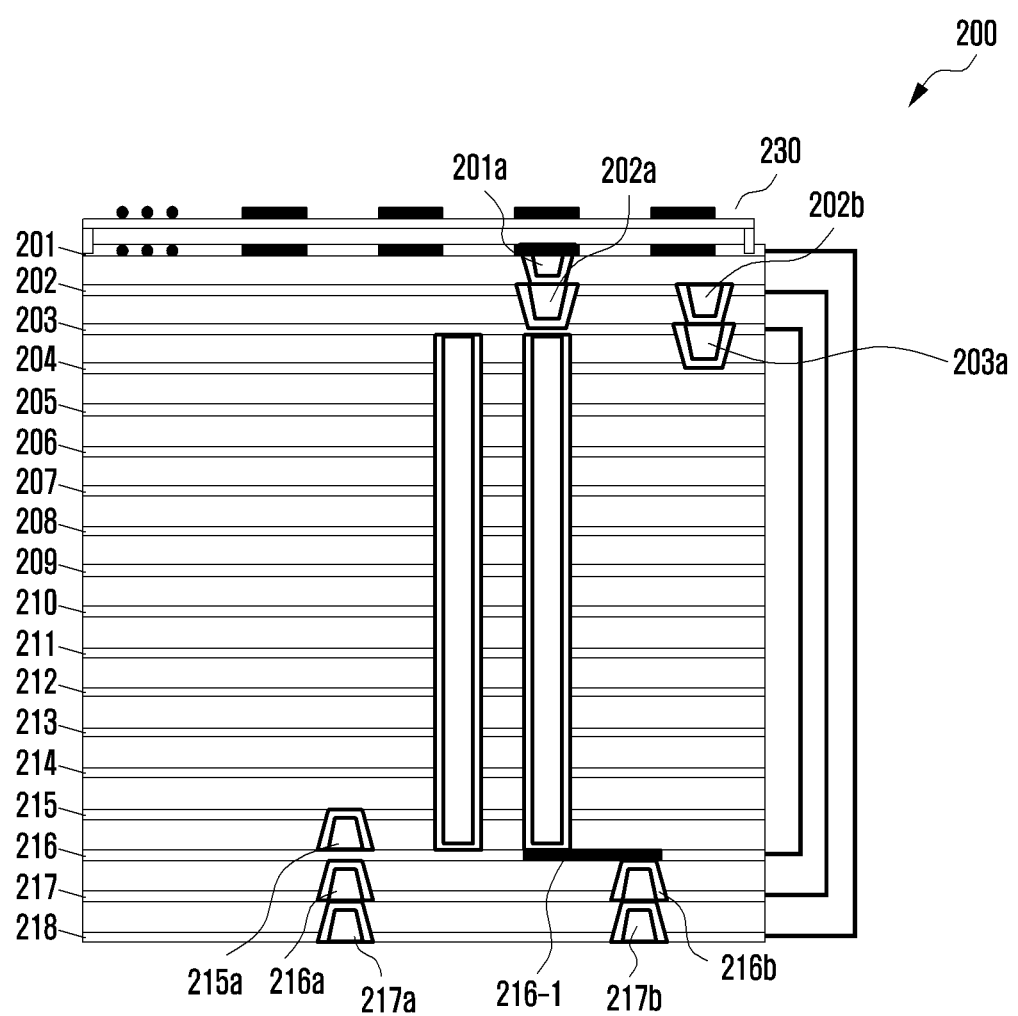
FIG. 2 is a cross-sectional view showing an antenna module and a printed circuit board (PCB) of an electronic apparatus according to an embodiment of the disclosure.

FIG. 2 is a cross-sectional view showing an antenna module and a PCB of an electronic apparatus according to an embodiment of the disclosure.

Referring to FIG. 2, an antenna module 230 may be disposed on a surface of a PCB 200. The antenna module 230 may be the same as or similar to the antenna module 110 of FIG. 1. The PCB 200 may be the same as or similar to the PCB 120 of FIG. 1.

The antenna module 230 may include an antenna substrate 231 and a plurality of antennas 212a to 212h. For example, a first antenna to a fourth antenna 212a to 212d may be disposed on the top of the antenna substrate 211. The antenna substrate 211 may be disposed on the top of the PCB 200. A fifth antenna to an eighth antenna 212e to 212h may be disposed on the top of the PCB 200.

The PCB 200 may include a plurality of layers 201 to 208. A first layer 201 to a third layer 213 may be referred to as a first stage. A fourth layer 204 to a fifteenth layer 215 may be referred to as a second stage. A sixteenth layer 216 to an eighteenth layer 218 may be referred to as a third stage. For example, the first layer 201 to the third layer 213 and the sixteenth layer 216 to the eighteenth layer 218 may be made of a material with a low Dissipation Factor (Df). The fourth layer 204 to the fifteenth layer 215 may be made of a Flame Retardant (FR)-4 material.

The antenna module 230 may be disposed on a surface of the first layer 201. The first layer 201 and the second layer 202 may be electrically connected to each other through a first via hole 201a. For example, the first via hole 201a may be electrically connected with a seventh antenna 212g.

The second layer 202 and the third layer 203 may be electrically connected to each other through a 2a-th via hole 202a and a 2b-th via hole 202b. The third layer 203 and the fourth layer 204 may be electrically connected to each other through a 3a-th via hole 203a. The third layer 203 to the sixteenth layer 216 may be electrically connected through a first through-hole 241 and a second through-hole 242.

The fifteenth layer 215 and the sixteenth layer 216 may be electrically connected through a 15a-th via hole 215a. The fifteenth layer 215 and the sixteenth layer 216 may be electrically connected through the first through-hole 241, the second through-hole 242, and the 15a-th via hole 215a.

The sixteenth layer 216 may include a 16-1-th conductive line 216-1. For example, an end of the 16-1-th conductive line 216-1 may be electrically connected with another end of the second through-hole 242. Another end of the 16-1-th conductive line 216-1 may be electrically connected with a 16a-th via hole 216a. The sixteenth layer 216 and the seventeenth layer 217 may be electrically connected through the 16a-th via hole 216a and a 16b-th via hole 216b. The seventeenth layer 217 and the eighteenth layer 218 may be electrically connected through a 17a-th via hole 217a and a 17b-th via hole 217b.

Figure 3:
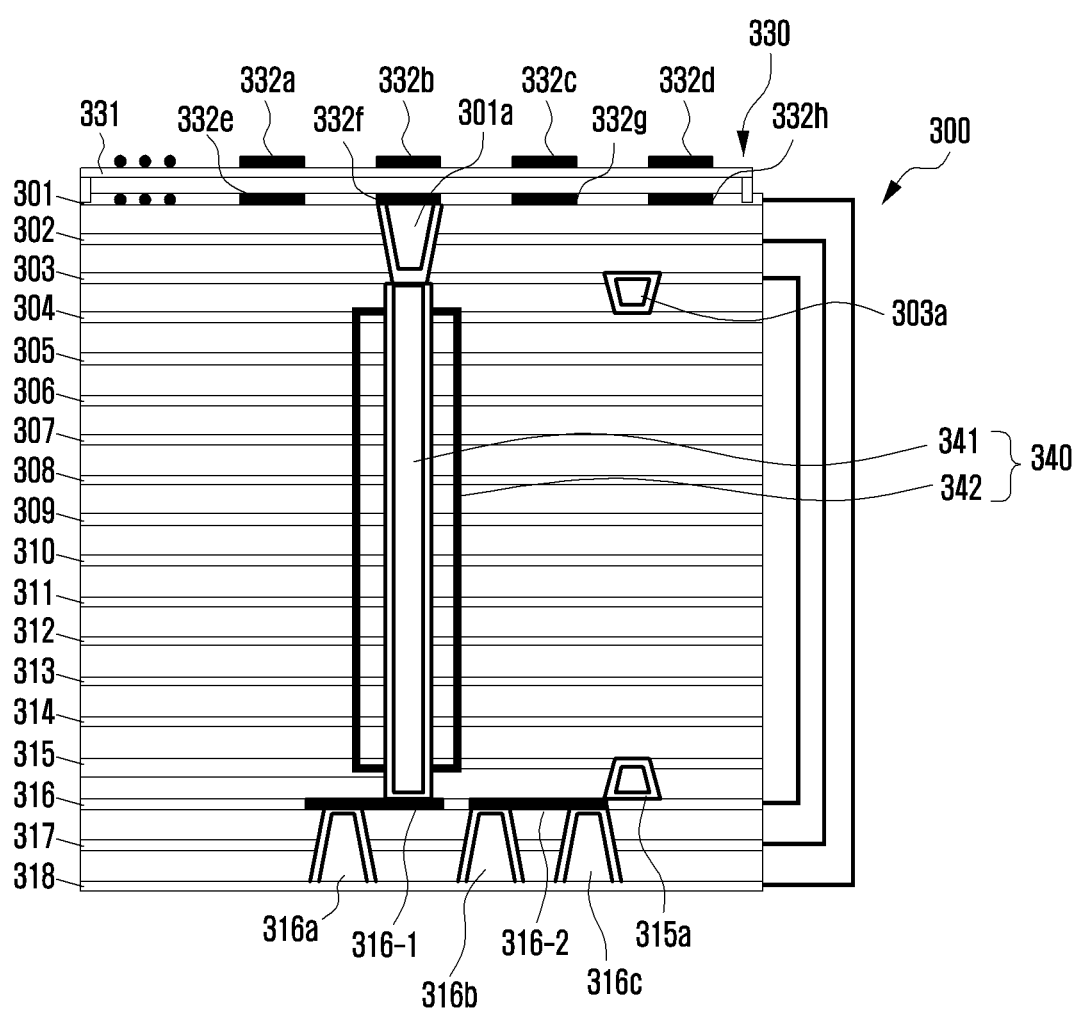
FIG. 3 is a cross-sectional view of an antenna module and a PCB according to an embodiment of the disclosure.

FIG. 3 is a cross-sectional view of an antenna module and a PCB according to an embodiment of the disclosure.

Referring to FIG. 3, an antenna module 330 may be disposed on a surface of a PCB 300. The antenna module 330 may be the same as or similar to the antenna module 110 of FIG. 1. The PCB 300 may be the same as or similar to the PCB 120 of FIG. 1.

The antenna module 330 may include an antenna substrate 331 and a plurality of antennas 312a to 312h. For example, a first antenna to a fourth antenna 312a to 312d may be disposed on the top of the antenna substrate 311. The antenna substrate 311 may be disposed on the top of the PCB 300. A fifth antenna to an eighth antenna 312e to 312h may be disposed on the top of the PCB 300.

The PCB 300 may include a plurality of layers 311 to 318. For example, the antenna module 330 may be disposed on a surface of a first layer 301. A 1a-th via hole 301a may connect first to third layers 301 to 303. The first layer 301 to the third layer 303 may be electrically connected to each other through the 1a-th via hole 301a. Among antennas 332a to 332h, an end of the 1a-th via hole 301a may be electrically connected with a seventh antenna 332f.

A 3a-th via hole 303a may be disposed through the third and fourth layers 303 and 304. The third layer 303 and the fourth layer 304 may be electrically connected to each other through the 3a-th via hole 303a.

The third layer 303 and the sixteenth layer 316 may be electrically connected through a coaxial plated through-hole 340. The coaxial plated through-hole 340 may include a coaxial feedline 341 and a plated region 342. The coaxial feedline 341 may connect the third to sixteenth layers 303 to 316. An end of the coaxial feedline 341 may be electrically connected with another end of the 1a-th via hole 301a. The plated region 342 may be formed through the fourth layer 304 to the fifteenth layer 315 along the coaxial feedline 341.

For example, the diameter of the coaxial plated through-hole 340 may be 0.7 to 1 mm. For example, the diameter of the coaxial plated through-hole 340 may be 0.8 mm. The diameter of the coaxial feedline 341 may be 0.2 mm. The diameter of the coaxial feedline 341 may be 0.175 mm. The diameter of the coaxial feedline 341 may be 0.15 mm.

The fifteenth layer 315 and the sixteenth layer 316 may be electrically connected through a 15a-th via hole 315a. The 15a-th via hole 315a may connect the fifteenth layer 315 and the sixteenth layer 316.

The fifteenth layer 315 and the sixteenth layer 316 may be electrically connected through a 15a-th via hole 315a. The sixteenth layer 316 to the eighteenth layer 318 may be electrically connected through a 16a-th via hole 316a, a 16b-th via hole 316b, and a 16c-th via hole 316c. The 16a-th via hole 316a may connect the sixteenth to eighteenth layers 316 to 318. The 16b-th via hole 316b may connect the sixteenth to eighteenth layers 316 to 318. The 16c-th via hole 316c may connect the sixteenth to eighteenth layers 316 to 318.

The sixteenth layer 316 may include a first conductive line 316-1 and a second conductive line 316-2. The first conductive line 316-1 may electrically connect the coaxial feedline 341 and the 16a-th via hole 316a. For example, an end of the first conductive line 316-1 may be electrically connected with another end of the coaxial feedline 341. Another end of the first conductive line 316-1 may be electrically connected with an end of the 16a-th via hole 316a. The second conductive line 316-2 may electrically connect the 16b-th via hole 316b and the 16c-th via hole 316c. For example, an end of the second conductive line 316-2 may be electrically connected with an end of the 16b-th via hole 316b. Another end of the second conductive line 316-2 may be electrically connected with an end of the 16c-th via hole 316c.

Figure 4:
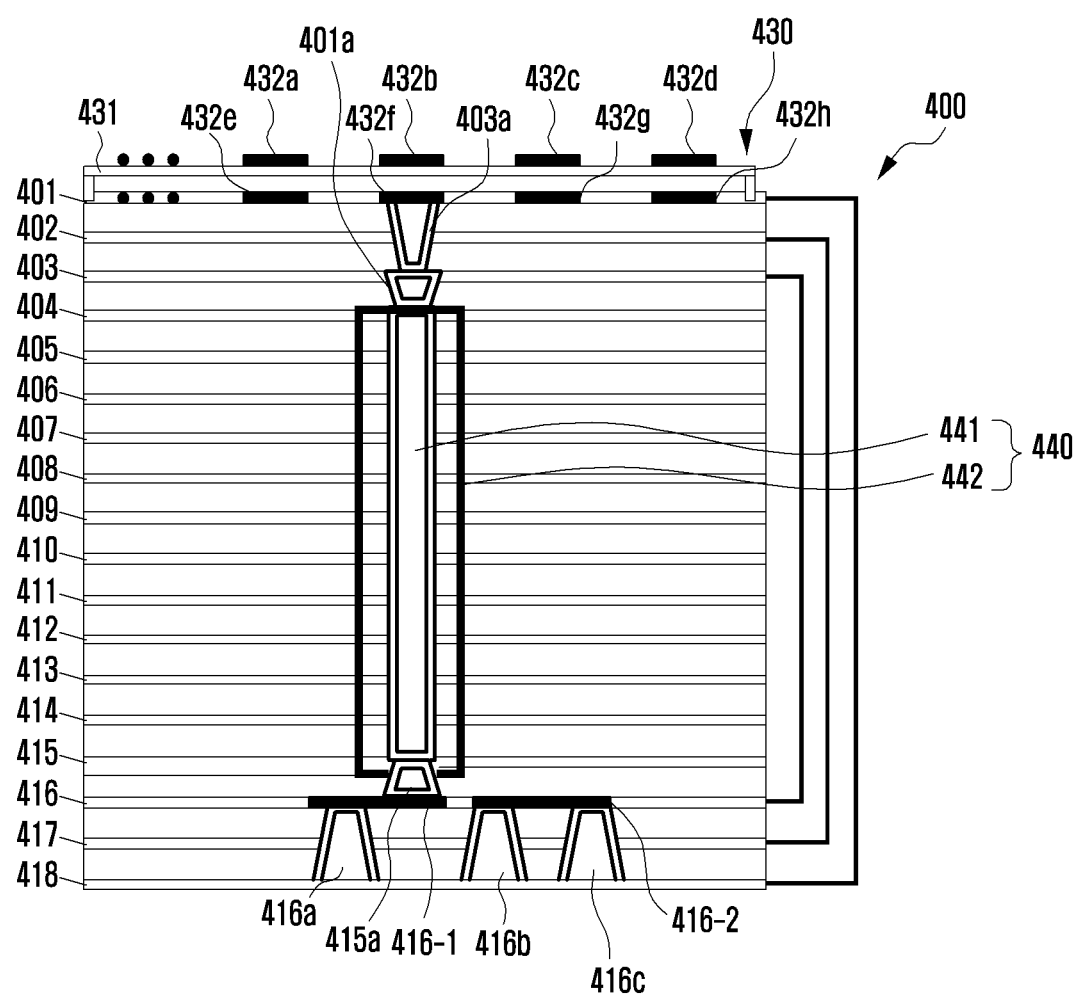
FIG. 4 is a cross-sectional view of an antenna module and a PCB according to an embodiment of the disclosure.

FIG. 4 is a cross-sectional view of an antenna module and a PCB according to an embodiment of the disclosure.

Referring to FIG. 4, an antenna module 430 may be disposed on a surface of a PCB 400. The antenna module 430 may be the same as or similar to the antenna module 110 of FIG. 1. The PCB 400 may be the same as or similar to the PCB 120 of FIG. 1.

The antenna module 430 may include an antenna substrate 431 and a plurality of antennas 412a to 412h. For example, a first antenna to a fourth antenna 412a to 412d may be disposed on the top of the antenna substrate 411. The antenna substrate 411 may be disposed on the top of the PCB 400. A fifth antenna to an eighth antenna 412e to 412h may be disposed on the top of the PCB 400.

The PCB 400 may include a plurality of layers 411 to 418. For example, the antenna module 430 may be disposed on a surface of a first layer 401. The first layer 401 and a second layer 402 may be electrically connected to each other through the 1a-th via hole 401a. The 1a-th via hole 401a may connect the first layer 401 and the second layer 402. Among antennas 432a to 432h, an end of the 1a-th via hole 401a may be electrically connected with a seventh antenna 432f. A third layer 403 and a fourth layer 404 may be electrically connected to each other through a 3a-th via hole 403a. The 3a-th via hole 403a may connect the third layer 403 and the fourth layer 404.

A fifteenth layer 415 and a sixteenth layer 416 may be electrically connected through a 15a-th via hole 415a. The 15a-th via hole 415a may connect the fifteenth layer 415 and the sixteenth layer 416.

A fourth layer 404 and the fifteenth layer 415 may be electrically connected through a coaxial plated through-hole 440. The coaxial plated through-hole 440 may include a coaxial feedline 441 and a plated region 442. The coaxial feedline 441 may be disposed through the fourth to fifteenth layers 404 to 415. An end of the coaxial feedline 441 may be electrically connected with another end of the 3a-th via hole 403a. The plated region 442 may be formed through the fourth layer 404 to the fifteenth layer 415 along the coaxial feedline 441.

The sixteenth layer 416 to an eighteenth layer 418 may be electrically connected through a 16a-th via hole 416a, a 16b-th via hole 416b, and a 16c-th via hole 316c. The 16a-th via hole 416a may connect the sixteenth to eighteenth layers 416 to 418. The 16b-th via hole 416b may connect the sixteenth to eighteenth layers 416 to 418. The 16c-th via hole 416c may connect the sixteenth to eighteenth layers 416 to 418.

The sixteenth layer 416 may include a first conductive line 416-1 and a second conductive line 416-2. The first conductive line 416-1 may electrically connect the 15a-th via hole 415a and the 16a-th via hole 416a. For example, an end of the first conductive line 416-1 may be electrically connected with another end of the 15a-th via hole 415a. Another end of the first conductive line 416-1 may be electrically connected with an end of the 16a-th via hole 416a. The second conductive line 416-2 may electrically connect the 16b-th via hole 416b and the 16c-th via hole 416c. For example, an end of the second conductive line 416-2 may be electrically connected with an end of the 16b-th via hole 416b. Another end of the second conductive line 416-2 may be electrically connected with an end of the 16c-th via hole 416c.

Figure 5:
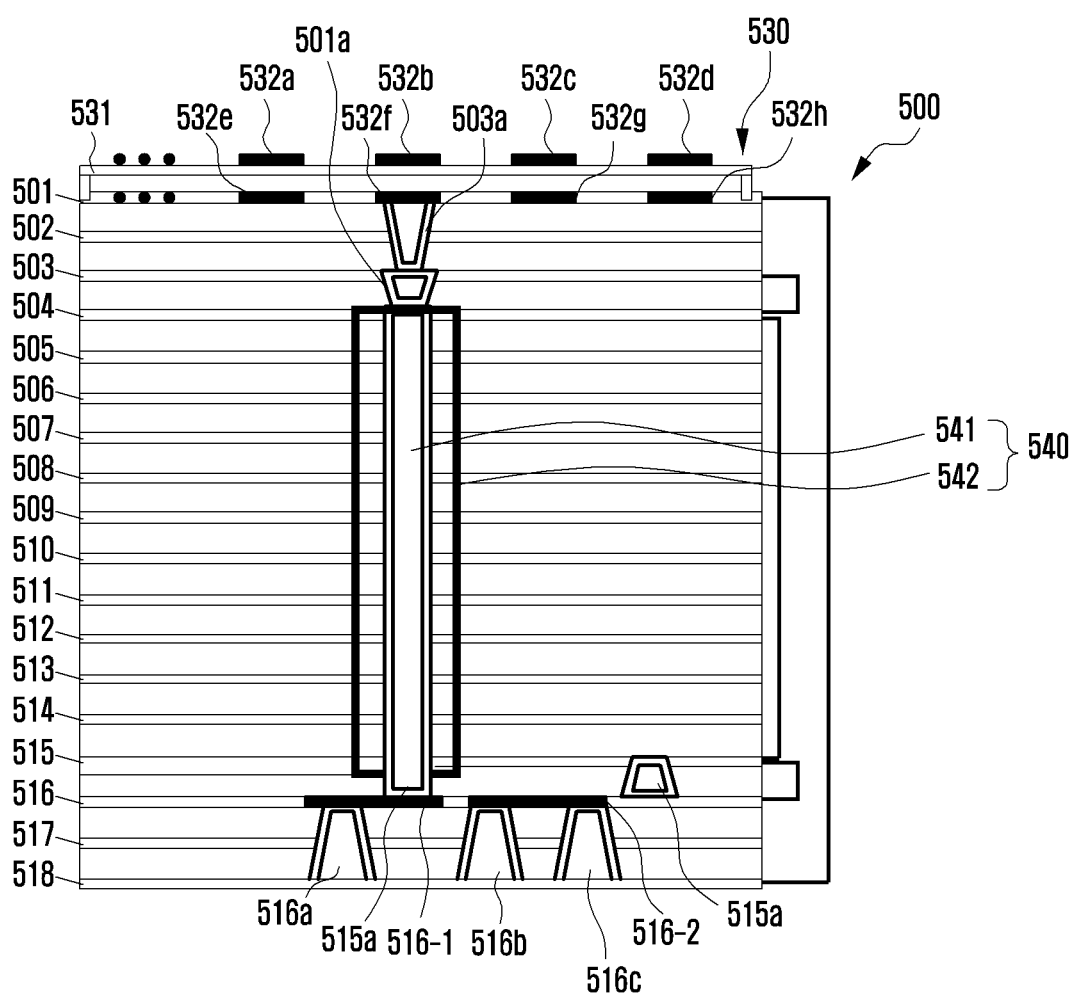
FIG. 5 is a cross-sectional view of an antenna module and a PCB according to an embodiment of the disclosure.

FIG. 5 is a cross-sectional view of an antenna module and a PCB according to an embodiment of the disclosure.

Referring to FIG. 5, an antenna module 530 may be disposed on a surface of a PCB 500. The antenna module 530 may be the same as or similar to the antenna module 110 of FIG. 1. The PCB 500 may be the same as or similar to the PCB 120 of FIG. 1.

The antenna module 530 may include an antenna substrate 531 and a plurality of antennas 512a to 512h. For example, a first antenna to a fourth antenna 512a to 512d may be disposed on the top of the antenna substrate 511. The antenna substrate 511 may be disposed on the top of the PCB 500. A fifth antenna to an eighth antenna 512e to 512h may be disposed on the top of the PCB 500.

The PCB 500 may include a plurality of layers 511 to 518. For example, the antenna module 530 may be disposed on a surface of a first layer 501. The first layer 501 and a second layer 502 may be electrically connected to each other through the 1a-th via hole 501a. The 1a-th via hole 501a may connect the first layer 501 and the second layer 502. Among antennas 532a to 532h, an end of the 1a-th via hole 501a may be electrically connected with a seventh antenna 532f. A third layer 503 and a fourth layer 504 may be electrically connected to each other through a 3a-th via hole 503a. The 3a-th via hole 503a may connect the third layer 503 and the fourth layer 504.

The fourth layer 504 and a sixteenth layer 516 may be electrically connected through a coaxial plated through-hole 540. The coaxial plated through-hole 540 may include a coaxial feedline 541 and a plated region 542. The coaxial feedline 541 may be disposed through the fourth to fifteenth layers 504 to 515. The coaxial feedline 541 may be electrically connected with the 3a-th via hole 503a. For example, an end of the coaxial feedline 541 may be electrically connected with another end of the 3a-th via hole 503a. The plated region 542 may be formed through the fourth layer 504 to the fifteenth layer 515 along the coaxial feedline 541.

The fifteenth layer 515 and the sixteenth layer 516 may be electrically connected through a 15a-th via hole 515a. The 15a-th via hole 515a may connect the fifteenth layer 515 and the sixteenth layer 516.

The sixteenth layer 516 to an eighteenth layer 518 may be electrically connected through a 16a-th via hole 516a, a 16b-th via hole 516b, and a 16c-th via hole 516c. The 16a-th via hole 516a may connect the sixteenth to eighteenth layers 516 to 518. The 16b-th via hole 516b may connect the sixteenth to eighteenth layers 516 to 518. The 16c-th via hole 516c may connect the sixteenth to eighteenth layers 516 to 518.

The sixteenth layer 516 may include a first conductive line 516-1 and a second conductive line 516-2. The first conductive line 516-1 may electrically connect the coaxial feedline 541 and the 16a-th via hole 516a. For example, an end of the first conductive line 516-1 may be electrically connected with another end of the coaxial feedline 541. Another end of the first conductive line 516-1 may be electrically connected with an end of the 16a-th via hole 516a. The second conductive line 516-2 may electrically connect the 16b-th via hole 516b and the 16c-th via hole 516c. For example, an end of the second conductive line 516-2 may be electrically connected with an end of the 16b-th via hole 516b. Another end of the second conductive line 516-2 may be electrically connected with an end of the 16c-th via hole 416c.

Figure 6:
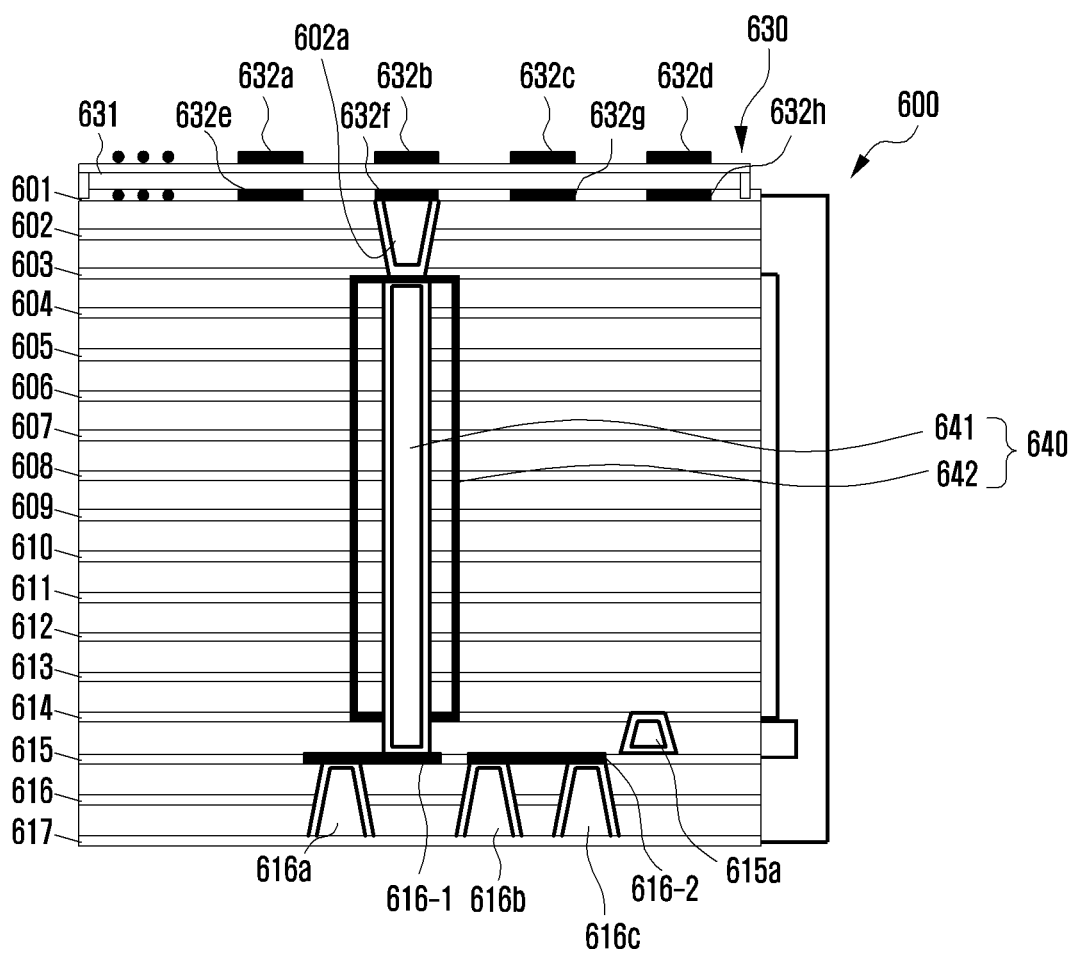
FIG. 6 is a cross-sectional view of an antenna module and a PCB according to an embodiment of the disclosure.

FIG. 6 is a cross-sectional view of an antenna module and a PCB according to an embodiment of the disclosure.

Referring to FIG. 6, an antenna module 630 may be disposed on a surface of a PCB 600. The antenna module 630 may be the same as or similar to the antenna module 110 of FIG. 1. The PCB 600 may be the same as or similar to the PCB 120 of FIG. 1.

The antenna module 630 may include an antenna substrate 631 and a plurality of antennas 612a to 612h. For example, a first antenna to a fourth antenna 612a to 612d may be disposed on the top of the antenna substrate 611. The antenna substrate 611 may be disposed on the top of the PCB 600. A fifth antenna to an eighth antenna 612e to 612h may be disposed on the top of the PCB 600.

The PCB 600 may include a plurality of layers 611 to 617. For example, the antenna module 630 may be disposed on a surface of a first layer 601. The first layer 601 to the third layer 603 may be electrically connected to each other through the 1a-th via hole 601a. The 1a-th via hole 601a may connect the first to third layers 601 to 603. Among antennas 632a to 632h, an end of the 1a-th via hole 601a may be electrically connected with a seventh antenna 632f.

A fourth layer 604 and a fifteenth layer 615 may be electrically connected through a coaxial plated through-hole 540. The coaxial plated through-hole 640 may include a coaxial feedline 641 and a plated region 642. The coaxial feedline 641 may be disposed through the third to fifteenth layers 603 to 615. An end of the coaxial feedline 641 may be electrically connected with another end of the 1a-th via hole 601a. The plated region 642 may be formed through the third layer 604 to a fourteenth layer 614 along the coaxial feedline 641.

The fourteenth layer 614 and the fifteenth layer 615 may be electrically connected through a 14a-th via hole 614a. The 14a-th via hole 614a may connect the fourteenth layer 614 and the fifteenth layer 615.

The fifteenth layer 615 to a seventeenth layer 617 may be electrically connected through a 15a-th via hole 615a, a 15b-th via hole 615b, and a 15c-th via hole 615c. The 15a-th via hole 615a may connect the fifteenth to seventeenth layers 615 to 617. The 15b-th via hole 616b may connect the fifteenth to seventeenth layers 615 to 617. The 15c-th via hole 615c may connect the fifteenth to seventeenth layers 615 to 617.

The fifteenth layer 615 may include a first conductive line 615-1 and a second conductive line 615-2. The first conductive line 615-1 may electrically connect the coaxial feedline 641 and the 15a-th via hole 615a. For example, an end of the first conductive line 615-1 may be electrically connected with another end of the coaxial feedline 641. Another end of the first conductive line 615-1 may be electrically connected with an end of the 15a-th via hole 615a. The second conductive line 615-2 may electrically connect the 15b-th via hole 615b and the 15c-th via hole 615c. For example, an end of the second conductive line 615-2 may be electrically connected with an end of the 15b-th via hole 615b. Another end of the second conductive line 615-2 may be electrically connected with an end of the 15c-th via hole 615c.

Figure 7:
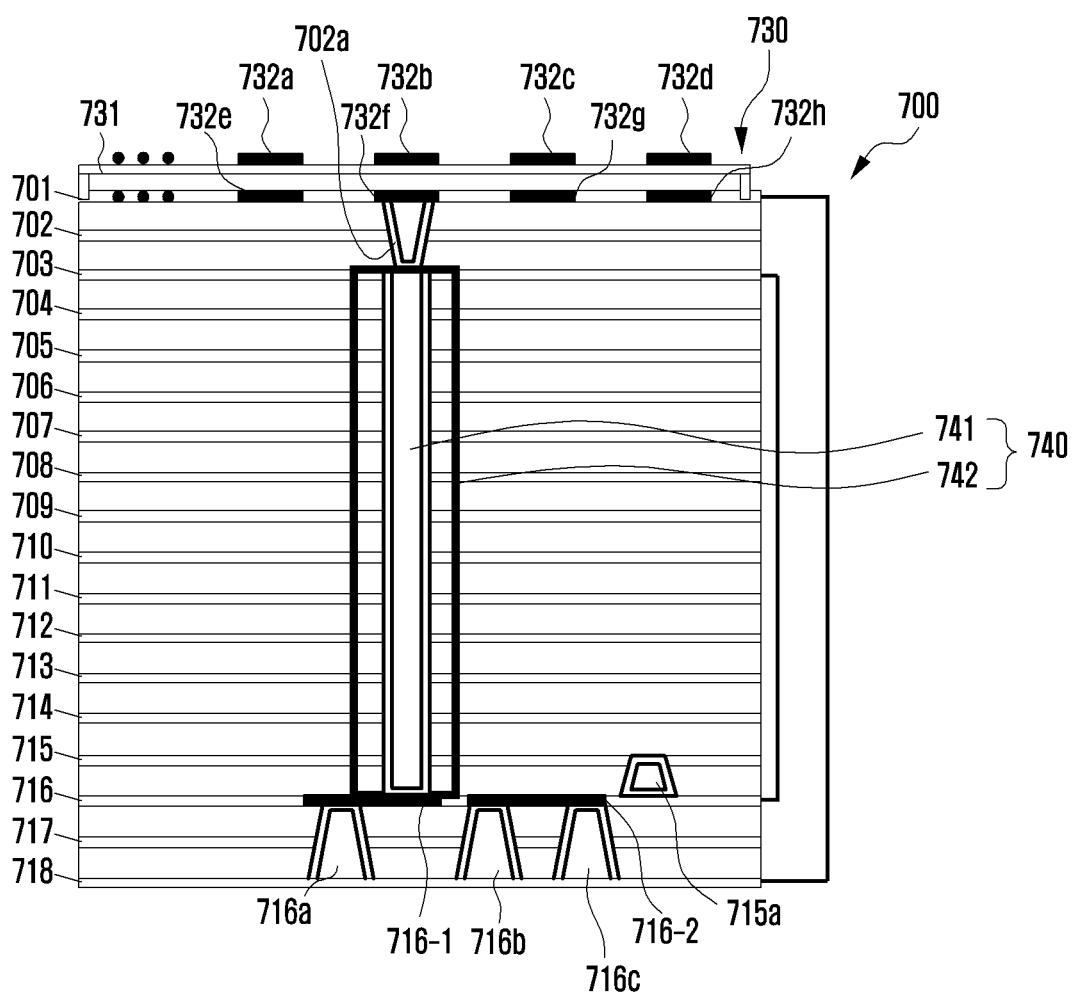
FIG. 7 is a cross-sectional view of an antenna module and a PCB according to an embodiment of the disclosure.

FIG. 7 is a cross-sectional view of an antenna module and a PCB according to an embodiment of the disclosure.

Referring to FIG. 7, an antenna module 730 may be disposed on a surface of a PCB 700. The antenna module 730 may be the same as or similar to the antenna module 110 of FIG. 1. The PCB 700 may be the same as or similar to the PCB 120 of FIG. 1.

The antenna module 730 may include an antenna substrate 731 and a plurality of antennas 712a to 712h. For example, a first antenna to a fourth antenna 712a to 712d may be disposed on the top of the antenna substrate 711. The antenna substrate 711 may be disposed on the top of the PCB 700. A fifth antenna to an eighth antenna 712e to 712h may be disposed on the top of the PCB 700.

The PCB 700 may include a plurality of layers 711 to 718. For example, the antenna module 730 may be disposed on a surface of a first layer 701. The first layer 701 to the third layer 703 may be electrically connected to each other through the 1a-th via hole 701a. The 1a-th via hole 701a may connect the first to third layers 701 to 703. Among antennas 732a to 732h, an end of the 1a-th via hole 701a may be electrically connected with a seventh antenna 732f.

The third layer 703 and the sixteenth layer 716 may be electrically connected through a coaxial plated through-hole 740. The coaxial plated through-hole 740 may include a coaxial feedline 741 and a plated region 742. The coaxial feedline 741 may be disposed through the third to sixteenth layers 703 to 716. The coaxial feedline 741 may be electrically connected with the 3a-th via hole 703a. For example, an end of the coaxial feedline 741 may be electrically connected with another end of the 3a-th via hole 703a. The plated region 742 may be formed through the third layer 703 to the sixteenth layer 716 along the coaxial feedline 741.

The fifteenth layer 715 and the sixteenth layer 716 may be electrically connected through a 15a-th via hole 715a. The 15a-th via hole 715a may connect the fifteenth layer 715 and the sixteenth layer 716.

The sixteenth layer 716 to an eighteenth layer 718 may be electrically connected through a 16a-th via hole 716a, a 16b-th via hole 716b, and a 16c-th via hole 716c. The 16a-th via hole 716a may connect the sixteenth to eighteenth layers 716 to 718. The 16b-th via hole 716b may connect the sixteenth to eighteenth layers 716 to 718. The 16c-th via hole 716c may connect the sixteenth to eighteenth layers 716 to 718.

The sixteenth layer 716 may include a first conductive line 716-1 and a second conductive line 716-2. The first conductive line 716-1 may electrically connect the coaxial feedline 741 and the 16a-th via hole 716a. For example, an end of the first conductive line 716-1 may be electrically connected with another end of the coaxial feedline 741. Another end of the first conductive line 716-1 may be electrically connected with an end of the 16a-th via hole 716a. The second conductive line 716-2 may electrically connect the 16b-th via hole 716b and the 16c-th via hole 716c. For example, an end of the second conductive line 716-2 may be electrically connected with an end of the 16b-th via hole 716b. Another end of the second conductive line 716-2 may be electrically connected with an end of the 16c-th via hole 716c.

Figure 8:
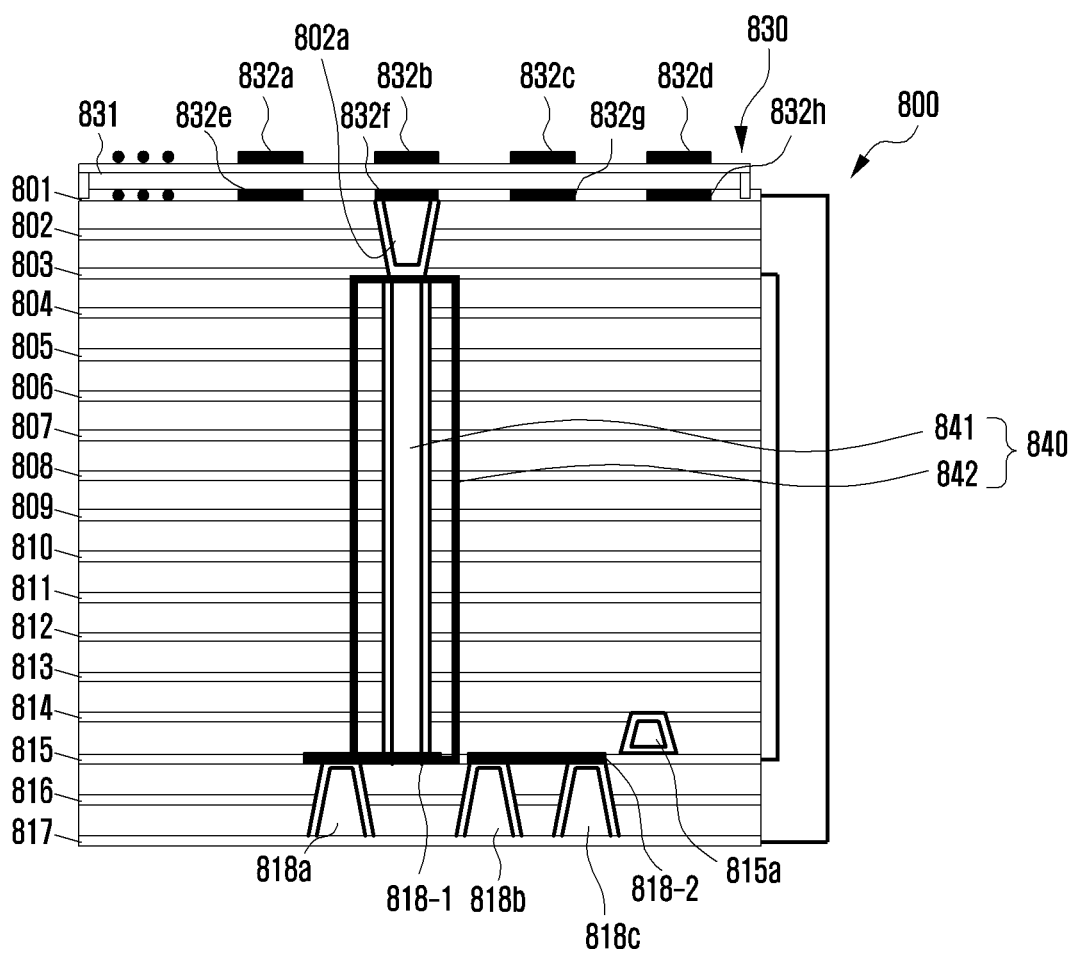
FIG. 8 is a cross-sectional view of an antenna module and a PCB according to an embodiment of the disclosure.

FIG. 8 is a cross-sectional view of an antenna module and a PCB according to an embodiment of the disclosure.

Referring to FIG. 8, an antenna module 830 may be disposed on a surface of a PCB 800. The antenna module 830 may be the same as or similar to the antenna module 110 of FIG. 1. The PCB 800 may be the same as or similar to the PCB 120 of FIG. 1.

The antenna module 830 may include an antenna substrate 831 and a plurality of antennas 812a to 812h. For example, a first antenna to a fourth antenna 812a to 812d may be disposed on the top of the antenna substrate 811. The antenna substrate 811 may be disposed on the top of the PCB 800. A fifth antenna to an eighth antenna 812e to 812h may be disposed on the top of the PCB 800.

The PCB 800 may include a plurality of layers 811 to 817. For example, the antenna module 830 may be disposed on a surface of a first layer 801. The first layer 801 to a third layer 803 may be electrically connected to each other through the 1a-th via hole 801a. The 1a-th via hole 801a may connect the first to third layers 801 to 803. Among antennas 832a to 832h, an end of the 1a-th via hole 801a may be electrically connected with a seventh antenna 832f.

The third layer 803 and a fifteenth layer 815 may be electrically connected through a coaxial plated through-hole 840. The coaxial plated through-hole 840 may include a coaxial feedline 841 and a plated region 842. The coaxial feedline 841 may disposed through the third to fifteenth layers 803 to 815. An end of the coaxial feedline 841 may be electrically connected with another end of the 1a-th via hole 801a. The plated region 842 may be formed through the third layer 803 to fifteenth layer 815 along the coaxial feedline 841.

The fourteenth layer 814 and the fifteenth layer 815 may be electrically connected through a 14a-th via hole 814a. The 14a-th via hole 814a may connect the fourteenth layer 814 and the fifteenth layer 815.

The fifteenth layer 815 to a seventeenth layer 817 may be electrically connected through a 15a-th via hole 815a, a 15b-th via hole 815b, and a 15c-th via hole 815c. The 15a-th via hole 815a may connect the fifteenth to seventeenth layers 815 to 817. The 15b-th via hole 815b may connect the fifteenth to seventeenth layers 815 to 817. The 15c-th via hole 815c may connect the fifteenth to seventeenth layers 815 to 817.

The fifteenth layer 815 may include a first conductive line 815-1 and a second conductive line 815-2. The first conductive line 815-1 may electrically connect the coaxial feedline 841 and the 15a-th via hole 815a. For example, an end of the first conductive line 815-1 may be electrically connected with another end of the coaxial feedline 841. Another end of the first conductive line 815-1 may be electrically connected with an end of the 15a-th via hole 815a. The second conductive line 815-2 may electrically connect the 15b-th via hole 815b and the 15c-th via hole 815c. For example, an end of the second conductive line 815-2 may be electrically connected with an end of the 15b-th via hole 815b. Another end of the second conductive line 815-2 may be electrically connected with an end of the 15c-th via hole 815c.

Figure 9:
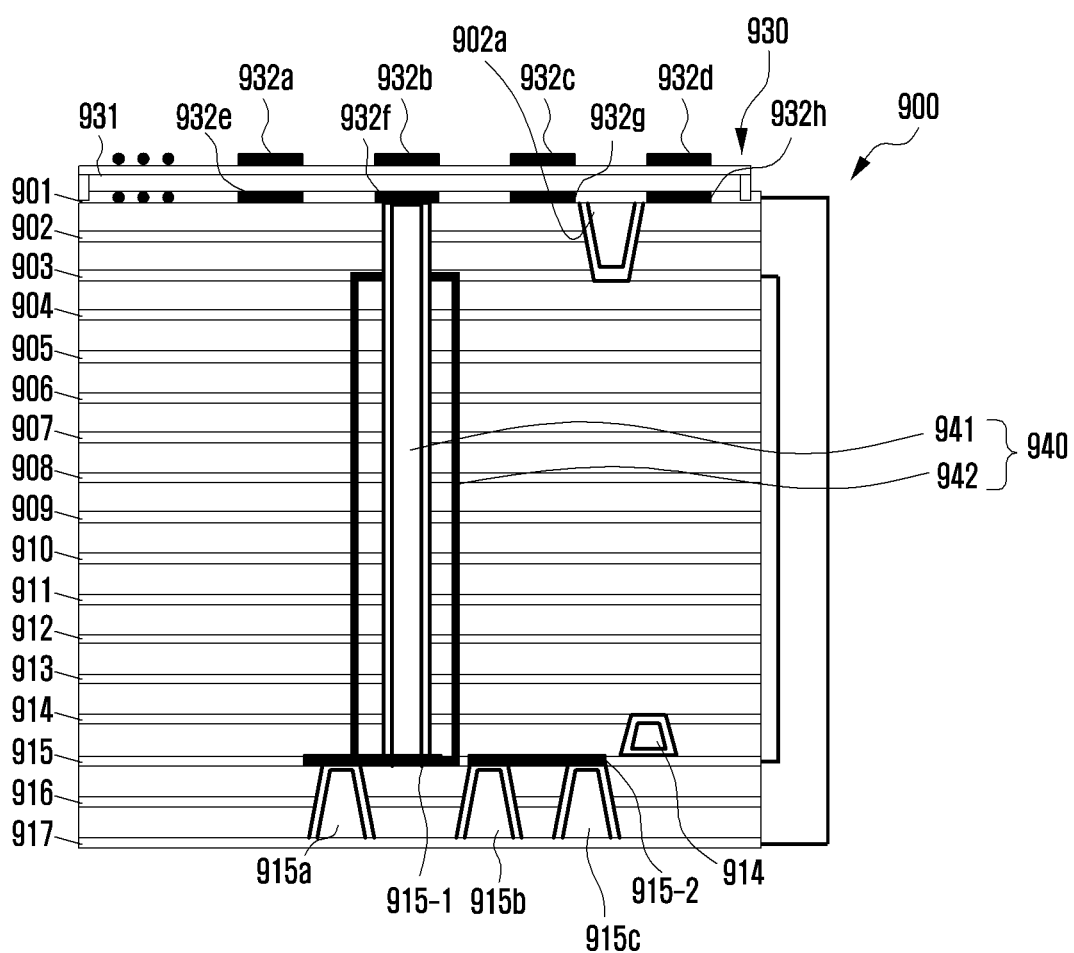
FIG. 9 is a cross-sectional view of an antenna module and a PCB according to an embodiment of the disclosure.

FIG. 9 is a cross-sectional view of an antenna module and a PCB according to an embodiment of the disclosure.

Referring to FIG. 9, an antenna module 930 may be disposed on a surface of a PCB 900. The antenna module 930 may be the same as or similar to the antenna module 110 of FIG. 1. The PCB 900 may be the same as or similar to the PCB 120 of FIG. 1.

The antenna module 930 may include an antenna substrate 931 and a plurality of antennas 912a to 912h. For example, a first antenna to a fourth antenna 912a to 912d may be disposed on the top of the antenna substrate 911. The antenna substrate 911 may be disposed on the top of the PCB 900. A fifth antenna to an eighth antenna 912e to 912h may be disposed on the top of the PCB 900.

The PCB 900 may include a plurality of layers 911 to 917. For example, the antenna module 930 may be disposed on a surface of a first layer 901. The first layer 901 to a third layer 903 may be electrically connected to each other through the 1a-th via hole 901a. The 1a-th via hole 901a may connect the first to third layers 901 to 903. Among antennas 932a to 932h, an end of the 1a-th via hole 901a may be electrically connected with a seventh antenna 932f.

The first layer 901 and a fifteenth layer 915 may be electrically connected through a coaxial plated through-hole 940. The coaxial plated through-hole 940 may include a coaxial feedline 941 and a plated region 942. The coaxial feedline 941 can connect the first to fifteenth layers 901 to 915. An end of the coaxial feedline 941 may be electrically connected with a seventh antenna 912f. The plated region 942 may be formed through the third layer 903 to fifteenth layer 915 along the coaxial feedline 941.

The fourteenth layer 914 and the fifteenth layer 915 may be electrically connected through a 14a-th via hole 914a. The 14a-th via hole 914a may connect the fourteenth layer 914 and the fifteenth layer 915.

The fifteenth layer 915 to a seventeenth layer 917 may be electrically connected through a 15a-th via hole 915a, a 15b-th via hole 915b, and a 15c-th via hole 915c. The 15a-th via hole 915a may connect the fifteenth to seventeenth layers 915 to 917. The 15b-th via hole 915b may connect the fifteenth to seventeenth layers 915 to 917. The 15c-th via hole 915c may connect the fifteenth to seventeenth layers 915 to 917.

The fifteenth layer 915 may include a first conductive line 915-1 and a second conductive line 915-2. The first conductive line 915-1 may electrically connect the coaxial feedline 941 and the 15a-th via hole 915a. For example, an end of the first conductive line 915-1 may be electrically connected with another end of the coaxial feedline 941. Another end of the first conductive line 915-1 may be electrically connected with an end of the 15a-th via hole 915a. The second conductive line 915-2 may electrically connect the 15b-th via hole 915b and the 15c-th via hole 915c. For example, an end of the second conductive line 915-2 may be electrically connected with an end of the 15b-th via hole 915b. Another end of the second conductive line 915-2 may be electrically connected with an end of the 15c-th via hole 915c.

Figure 10:
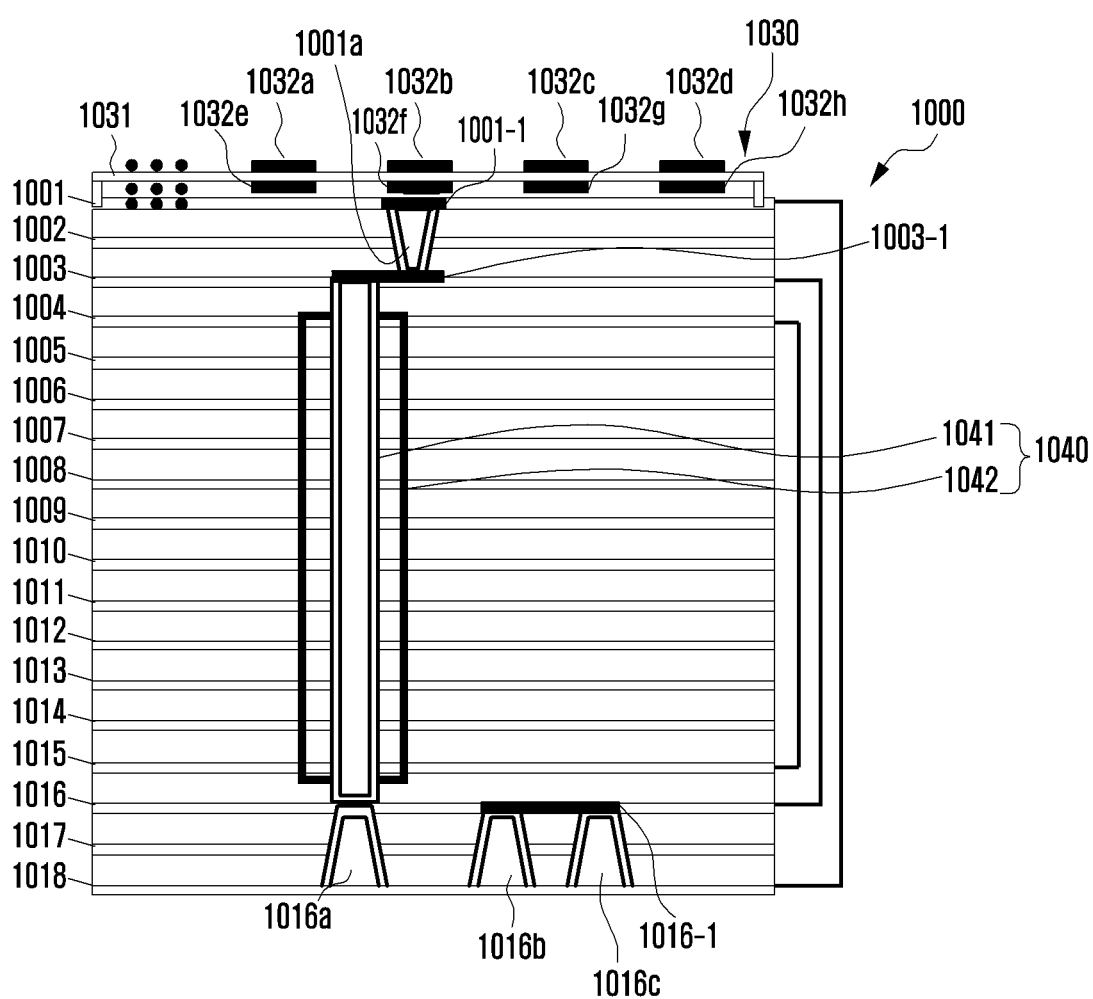
FIG. 10 is a cross-sectional view of an antenna module and a PCB according to an embodiment of the disclosure.

FIG. 10 is a cross-sectional view of an antenna module and a PCB according to an embodiment of the disclosure.

Referring to FIG. 10, an antenna module 1030 may be disposed on a surface of a PCB 1000. The antenna module 1030 may be the same as or similar to the antenna module 110 of FIG. 1. The PCB 1000 may be the same as or similar to the PCB 120 of FIG. 1.

The antenna module 1030 may include an antenna substrate 1031 and a plurality of antennas 1012a to 1012h. For example, a first antenna to a fourth antenna 1012a to 1012d may be disposed on the top of the antenna substrate 1011. A fifth antenna to an eighth antenna 1012e to 1012h may be disposed on the top of the PCB 1000. The antenna substrate 1011 may be disposed on the bottom of the PCB 1000.

The PCB 1000 may include a plurality of layers 1011 to 1018. The antenna module 1030 may be disposed on a surface of the first layer 1001. The first layer 1001 may include a first conductive line 1001-1. A 1a-th via hole 1001a may connect the first to third layers 1001 to 1003. The third layer 1003 may include a second conductive line 1003-1. The first layer 1001 to the third layer 1003 may be electrically connected to each other through the 1a-th via hole 1001a. For example, an end of the 1a-th via hole 1001a may be electrically connected with the first conductive line 1001-1. Among antennas 1032a to 1032h, another end of the 1a-th via hole 1001a may be electrically connected with the second conductive line 1003-1 and with a seventh antenna 1032f.

The third layer 1003 and the sixteenth layer 1016 may be electrically connected through a coaxial plated through-hole 1040. The coaxial plated through-hole 1040 may include a coaxial feedline 1041 and a plated region 1042. The coaxial feedline 1041 can connect the third to fifteenth layers 1003 to 1016. An end of the coaxial feedline 1041 may be electrically connected with another end of the second conductive line 1003-1. The plated region 1042 may be formed through the fourth layer 1004 to the fifteenth layer 1015 along the coaxial feedline 1041.

The sixteenth layer 1016 to an eighteenth layer 1018 may be electrically connected through a 16a-th via hole 1016a, a 16b-th via hole 1016b, and a 16c-th via hole 1016c. The 16a-th via hole 1016a may connect the sixteenth to eighteenth layers 1016 to 1018. The 16b-th via hole 1016b may connect the sixteenth to eighteenth layers 1016 to 1018. The 16c-th via hole 1016c may connect the sixteenth to eighteenth layers 1016 to 1018. An end of the 16a-th via hole 1016a may be electrically connected with another end of the coaxial feedline 1041.

The sixteenth layer 1016 may include a third conductive line 1016-1. The third conductive line 1016-1 may electrically connect the 16b-th via hole 1016b and the 16c-th via hole 1016c. For example, an end of the third conductive line 1016-1 may be electrically connected with an end of the 16b-th via hole 1016b. Another end of the third conductive line 1016-1 may be electrically connected with an end of the 16c-th via hole 1016c.

Figure 11:
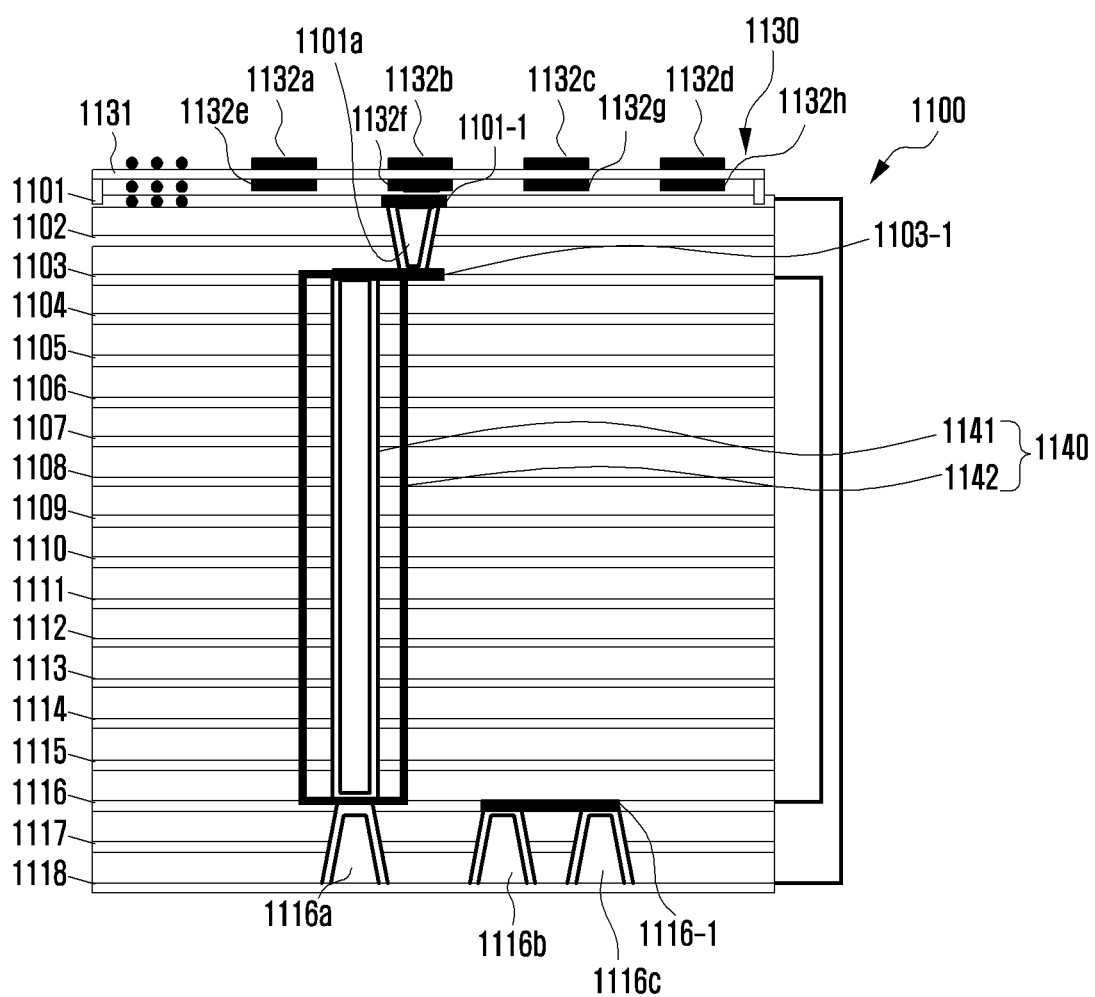
FIG. 11 is a cross-sectional view of an antenna module and a PCB according to an embodiment of the disclosure.

FIG. 11 is a cross-sectional view of an antenna module and a PCB according to an embodiment of the disclosure.

Referring to FIG. 11, an antenna module 1130 may be disposed on a surface of a PCB 1100. The antenna module 1130 may be the same as or similar to the antenna module 110 of FIG. 1. The PCB 1100 may be the same as or similar to the PCB 120 of FIG. 1.

The antenna module 1130 may include an antenna substrate 1131 and a plurality of antennas 1112a to 1112h. For example, a first antenna to a fourth antenna 1112a to 1112d may be disposed on the top of the antenna substrate 1111. A fifth antenna to an eighth antenna 1112e to 1112h may be disposed on the top of the PCB 1100. The antenna substrate 1111 may be disposed on the top of the PCB 1100.

The PCB 1100 may include a plurality of layers 1111 to 1118. The antenna module 1130 may be disposed on a surface of a first layer 1101. The first layer 1101 may include a first conductive line 1101-1. A 1a-th via hole 1101a may connect the first to third layers 1101 to 1103. The third layer 1103 may include a second conductive line 1103-1. The first layer 1101 to the third layer 1103 may be electrically connected to each other through the 1a-th via hole 1101a. For example, an end of the 1a-th via hole 1101a may be electrically connected with the first conductive line 1101-1. Among antennas 1132a to 1132h, another end of the 1a-th via hole 1101a may be electrically connected with the second conductive line 1103-1 and with a seventh antenna 1132f.

The third layer 1103 and a sixteenth layer 1116 may be electrically connected through a coaxial plated through-hole 1140. The coaxial plated through-hole 1140 may include a coaxial feedline 1141 and a plated region 1142. The coaxial feedline 1141 may disposed through the third to fifteenth layers 1103 to 1116. An end of the coaxial feedline 1141 may be electrically connected with another end of the second conductive line 1103-1. The plated region 1142 may be formed through the third layer 1103 to the sixteenth layer 1116 along the coaxial feedline 1141.

The sixteenth layer 1116 to an eighteenth layer 1118 may be electrically connected through a 16a-th via hole 1116a, a 16b-th via hole 1116b, and a 16c-th via hole 1116c. The 16a-th via hole 1116a may connect the sixteenth to eighteenth layers 1116 to 1118. The 16b-th via hole 1116b may connect the sixteenth to eighteenth layers 1116 to 1118. The 16c-th via hole 1116c may connect the sixteenth to eighteenth layers 1116 to 1118. An end of the 16a-th via hole 1116a may be electrically connected with another end of the coaxial feedline 1141.

The sixteenth layer 1116 may include a third conductive line 1116-1. The third conductive line 1116-1 may electrically connect the 16b-th via hole 1116b and the 16c-th via hole 1116c. For example, an end of the third conductive line 1116-1 may be electrically connected with an end of the 16b-th via hole 1116b. Another end of the third conductive line 1116-1 may be electrically connected with an end of the 16c-th via hole 1116c.

Figure 12:
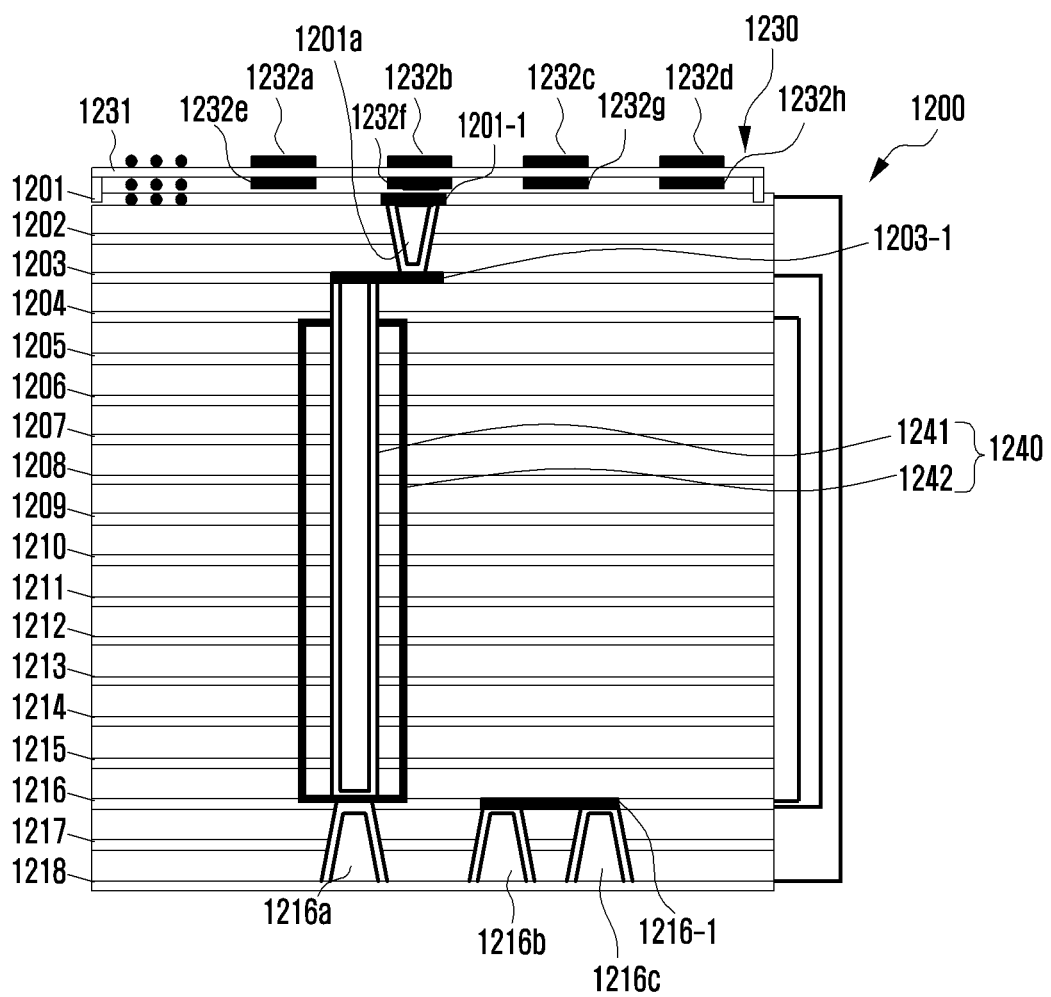
FIG. 12 is a cross-sectional view of an antenna module and a PCB according to an embodiment of the disclosure.

FIG. 12 is a cross-sectional view of an antenna module and a PCB according to an embodiment of the disclosure.

Referring to FIG. 12, an antenna module 1230 may be disposed on a surface of a PCB 1200. The antenna module 1230 may be the same as or similar to the antenna module 110 of FIG. 1. The PCB 1200 may be the same as or similar to the PCB 120 of FIG. 1.

The antenna module 1230 may include an antenna substrate 1231 and a plurality of antennas 1212a to 1212h. For example, a first antenna to a fourth antenna 1212a to 1212d may be disposed on the top of the antenna substrate 1211. A fifth antenna to an eighth antenna 1212e to 1212h may be disposed on the top of the PCB 1200. The antenna substrate 1211 may be disposed on the top of the PCB 1200.

The PCB 1200 may include a plurality of layers 1211 to 1218. The antenna module 1230 may be disposed on a surface of a first layer 1201. The first layer 1201 may include a first conductive line 1201-1. A 1a-th via hole 1201a may connect the first to third layers 1201 to 1203. The third layer 1203 may include a second conductive line 1203-1. The first layer 1201 to the third layer 1203 may be electrically connected to each other through the 1a-th via hole 1201a. For example, an end of the 1a-th via hole 1201a may be electrically connected with the first conductive line 1201-1. Among antennas 1232a to 1232h, another end of the 1a-th via hole 1201a may be electrically connected with the second conductive line 1203-1 and with a seventh antenna 1232f.

The third layer 1203 and a sixteenth layer 1216 may be electrically connected through a coaxial plated through-hole 1240. The coaxial plated through-hole 1240 may include a coaxial feedline 1241 and a plated region 1242. The coaxial feedline 1241 may be disposed through the third to fifteenth layers 1203 to 1216. An end of the coaxial feedline 1241 may be electrically connected with another end of the second conductive line 1203-1. The plated region 1242 may be formed through the fourth layer 1204 to the sixteenth layer 1216 along the coaxial feedline 1241.

The sixteenth layer 1216 to an eighteenth layer 1218 may be electrically connected through a 16a-th via hole 1216a, a 16b-th via hole 1216b, and a 16c-th via hole 1216c. The 16a-th via hole 1216a may connect the sixteenth to eighteenth layers 1216 to 1218. The 16b-th via hole 1216b may connect the sixteenth to eighteenth layers 1216 to 1218. The 16c-th via hole 1216c may connect the sixteenth to eighteenth layers 1216 to 1218. An end of the 16a-th via hole 1216a may be electrically connected with another end of the coaxial feedline 1241.

The sixteenth layer 1216 may include a third conductive line 1216-1. The third conductive line 1216-1 may electrically connect the 16b-th via hole 1216b and the 16c-th via hole 1216c. For example, an end of the third conductive line 1216-1 may be electrically connected with an end of the 16b-th via hole 1216b. Another end of the third conductive line 1216-1 may be electrically connected with an end of the 16c-th via hole 1216c.

Figure 13:
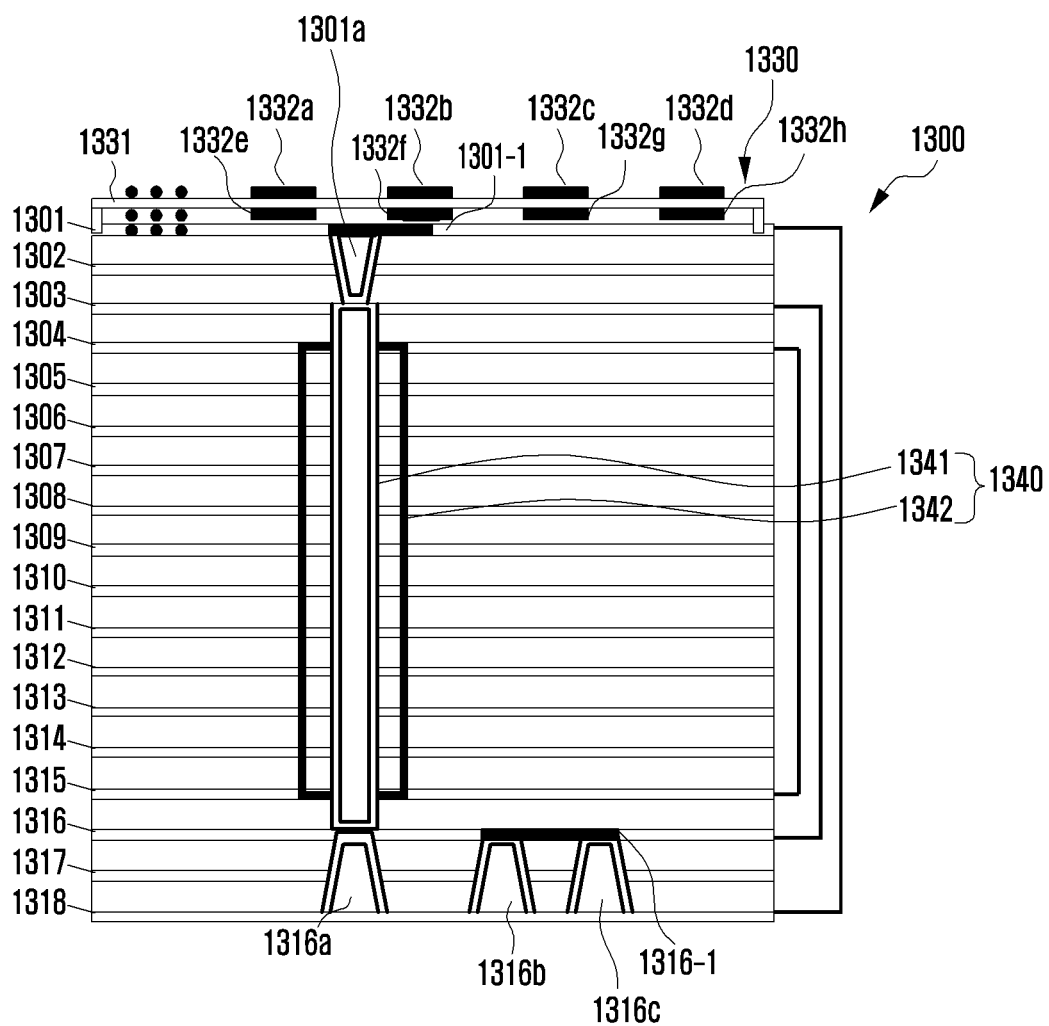
FIG. 13 is a cross-sectional view of an antenna module and a PCB according to an embodiment of the disclosure.

FIG. 13 is a cross-sectional view of an antenna module and a PCB according to an embodiment of the disclosure.

Referring to FIG. 13, an antenna module 1330 may be disposed on a surface of a PCB 1300. The antenna module 1330 may be the same as or similar to the antenna module 110 of FIG. 1. The PCB 1300 may be the same as or similar to the PCB 120 of FIG. 1.

The antenna module 1330 may include an antenna substrate 1331 and a plurality of antennas 1312a to 1312h. For example, a first antenna to a fourth antenna 1312a to 1312d may be disposed on the top of the antenna substrate 1311. A fifth antenna to an eighth antenna 1312e to 1312h may be disposed on the top of the PCB 1300. The antenna substrate 1311 may be disposed on the top of the PCB 1300.

The PCB 1300 may include a plurality of layers 1311 to 1318. The antenna module 1330 may be disposed on a surface of a first layer 1301. The first layer 1301 may include a first conductive line 1301-1 and a second conductive line 1301-2. The first conductive line 1301-1 and the second conductive line 1301-2 may be electrically connected.

A 1a-th via hole 1301a may be disposed through the first to third layers 1301 to 1303. The first layer 1301 to the third layer 1303 may be electrically connected to each other through the 1a-th via hole 1301a. For example, among antennas 1332a to 1332h, an end of the 1a-th via hole 1301a may be electrically connected with the second conductive line 1301-2 and with a seventh antenna 1332f.

The third layer 1303 and a sixteenth layer 1316 may be electrically connected through a coaxial plated through-hole 1340. The coaxial plated through-hole 1340 may include a coaxial feedline 1341 and a plated region 1342. The coaxial feedline 1341 may be disposed through the third to sixteenth layers 1303 to 1316. An end of the coaxial feedline 1341 may be connected with another end of the 1a-th via hole 1301a. The plated region 1342 may be formed through the fourth layer 1304 to the fifteenth layer 1315 along the coaxial feedline 1341.

The sixteenth layer 1316 to the eighteenth layer 1318 may be electrically connected through a 16a-th via hole 1316a, a 16b-th via hole 1316b, and a 16c-th via hole 1316c. The 16a-th via hole 1316a may connect the sixteenth to eighteenth layers 1316 to 1318. The 16b-th via hole 1316b may connect the sixteenth to eighteenth layers 1316 to 1318. The 16c-th via hole 1316c may connect the sixteenth to eighteenth layers 1316 to 1318. An end of the 16a-th via hole 1316a may be electrically connected with another end of the coaxial feedline 1341.

The sixteenth layer 1316 may include a third conductive line 1316-1. The third conductive line 1316-1 may electrically connect the 16b-th via hole 1316b and the 16c-th via hole 1316c. For example, an end of the third conductive line 1316-1 may be electrically connected with an end of the 16b-th via hole 1316b. Another end of the third conductive line 1316-1 may be electrically connected with an end of the 16c-th via hole 1316c.

Figure 14:
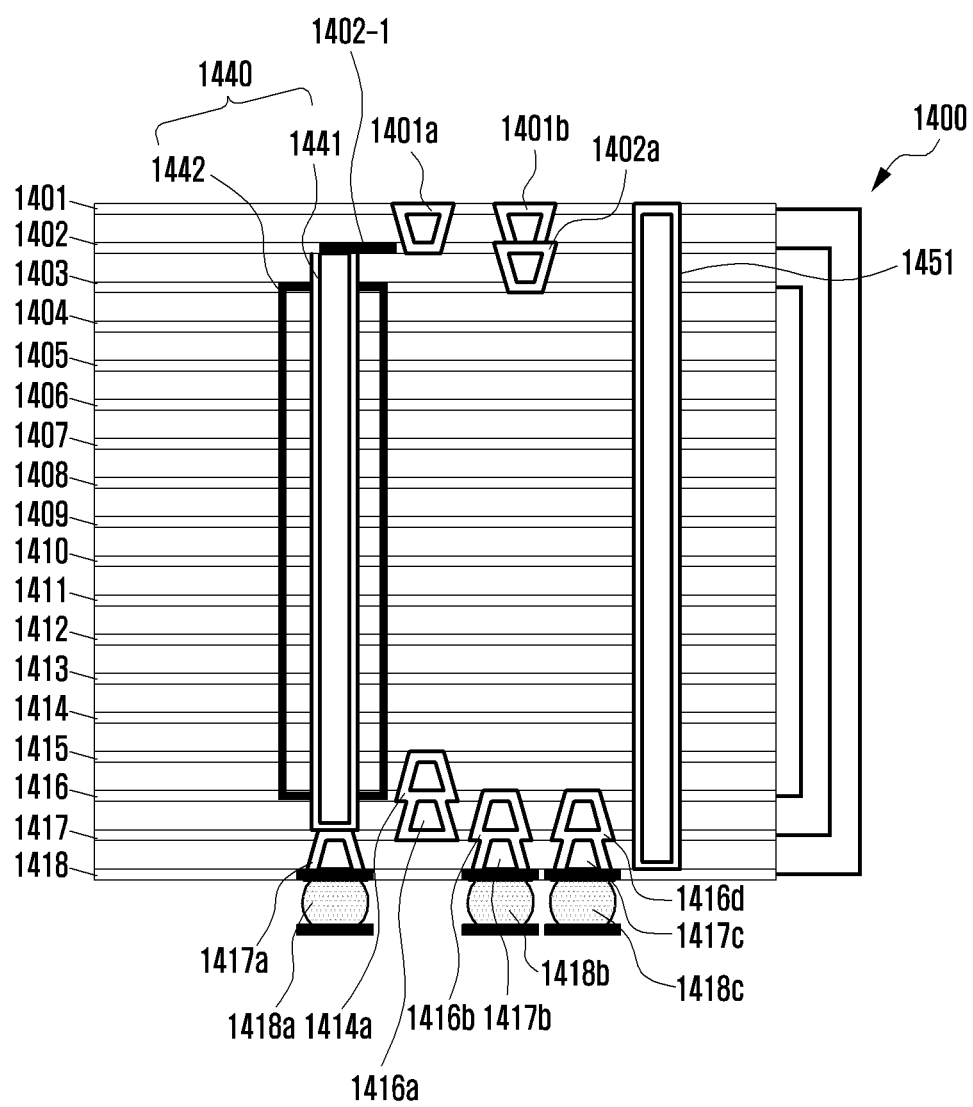
FIG. 14 is a cross-sectional view of a PCB according to an embodiment of the disclosure.

FIG. 14 is a cross-sectional view of a PCB according to an embodiment of the disclosure.

Referring to FIG. 14, a PCB 1400 may be the same as or similar to the PCB 120 of FIG. 1. For example, the PCB 1400 may include a plurality of layers 1411 to 1418. A first layer 1401 and a second layer 1402 may be electrically connected through a 1a-th via hole 1401a and a 1b-th via hole 1401b.

The second layer 1402 and a third layer 1403 may be electrically connected through a 2a-th via hole 1402a. An end of the 2a-th via hole 1402a may be electrically connected with the 1b-th via hole 1401b.

The second layer 1402 and a seventeenth layer 1417 may be electrically connected through a coaxial plated through-hole 1440. The coaxial plated through-hole 1440 may include a coaxial feedline 1441 and a plated region 1442. The coaxial feedline 1441 may be disposed through the second to sixteenth layers 1402 to 1416.

The second layer 1402 may include a first conductive line 1402-1. For example, an end of the first conductive line 1402-1 may be electrically connected with the 1a-th via hole 1401a. Another end of the first conductive line 1402-1 may be electrically connected with an end of the coaxial feedline 1441.

The plated region 1442 may be formed through the third layer 1403 to fifteenth layer 1415 along the coaxial feedline 1441. For example, the diameter of the coaxial plated through-hole 1440 may be 0.7 to 1 mm. For example, the diameter of the coaxial plated through-hole 1440 may be 0.8 mm. The diameter of the coaxial feedline 1441 may be 0.2 mm. The diameter of the coaxial feedline 1441 may be 0.175 mm. The diameter of the coaxial feedline 1441 may be 0.15 mm.

The fifteenth layer 1415 and the sixteenth layer 1416 may be electrically connected through a 15a-th via hole 1415a.

The sixteenth layer 1416 and the seventeenth layer 1417 may be electrically connected through a 16a-th via hole 1416a, a 16b-th via hole 1416b, and a 16c-th via hole 1416c. An end of the 16a-th via hole 1416a may be electrically connected with the 15a-th via hole 1415a.

The sixteenth layer 1416 may include a first conductive line 1416-1. An end of the first conductive line 1416-1 may be electrically connected with an end of the 16b-th via hole 1416b. Another end of the first conductive line 1416-1 may be electrically connected with an end of the 16c-th via hole 1416c.

The seventeenth layer 1417 and the eighteenth layer 1418 may be electrically connected through a 17a-th via hole 1417a, a 17b-th via hole 1417b, and a 17c-th via hole 1417c. An end of the 17a-th via hole 1417a may be electrically connected with another end of the coaxial feedline 1441. Another end of the 17a-th via hole 1417a may be electrically connected with a first ball 1418a. An end of the 17b-th via hole 1417b may be electrically connected with another end of the 16b-th via hole 1416b. Another end of the 17b-th via hole 1417b may be electrically connected with a second ball 1418b. An end of the 17c-th via hole 1417c may be electrically connected with another end of the 16c-th via hole 1416c. Another end of the 17c-th via hole 1417c may be electrically connected with a third ball 1418c.

The first layer 1401 to the eighteenth layer 1418 may be electrically connected through a through-hole 1451. The through-hole 1451 may be formed through the first to eighteenth layers 1401 to 1418.

Figure 15:
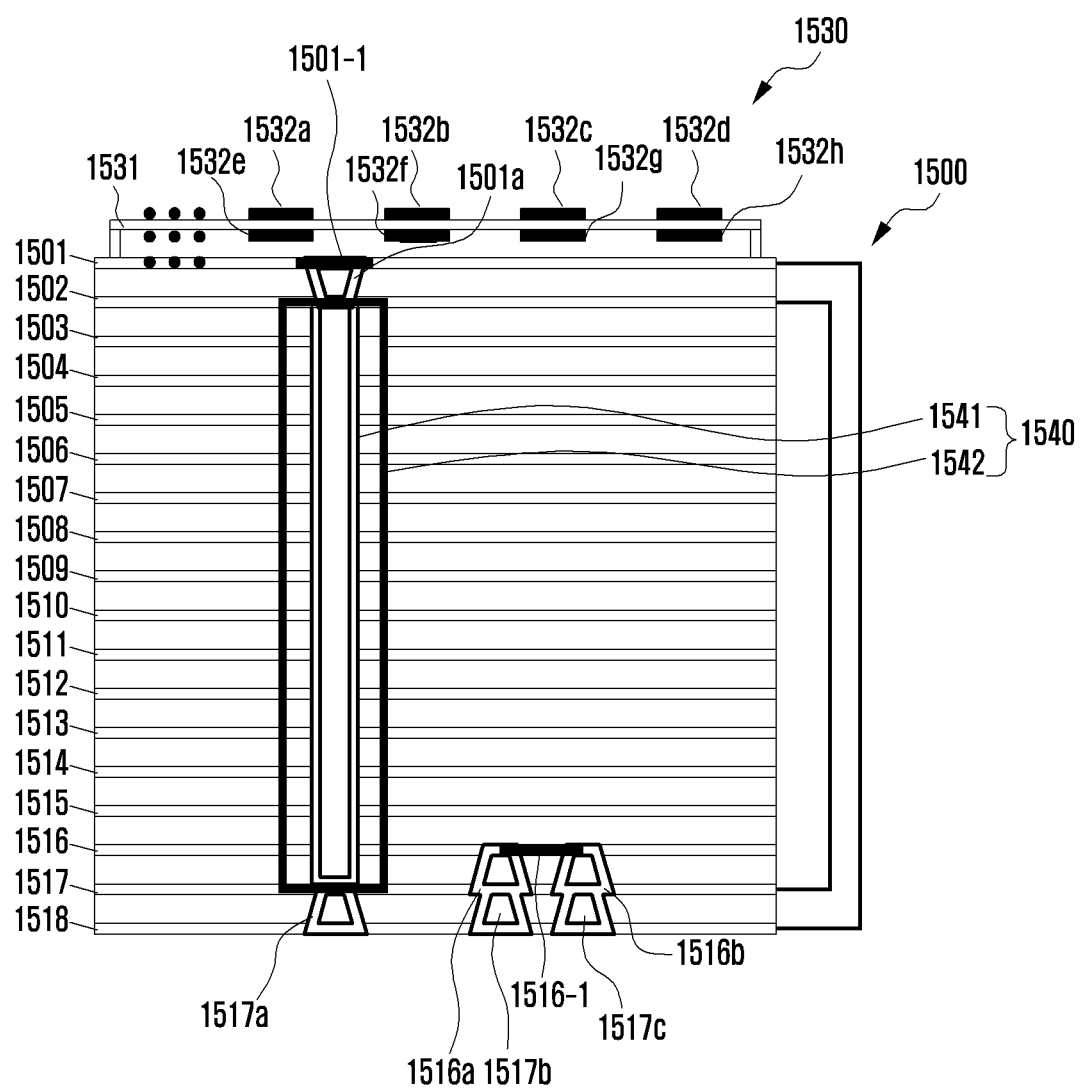
FIG. 15 is a cross-sectional view of an antenna module and a PCB according to an embodiment of the disclosure.

FIG. 15 is a cross-sectional view of an antenna module and a PCB according to an embodiment of the disclosure.

Referring to FIG. 15, an antenna module 1530 may be disposed on a surface of a PCB 1500. The antenna module 1530 may be the same as or similar to the antenna module 110 of FIG. 1. The PCB 1500 may be the same as or similar to the PCB 120 of FIG. 1.

The antenna module 1530 may include an antenna substrate 1531 and a plurality of antennas 1512a to 212h. For example, a first antenna to a fourth antenna 1512a to 1512d may be disposed on the top of the antenna substrate 1511. The antenna substrate 1511 may be disposed on the top of the PCB 1500. A fifth antenna to an eighth antenna 1512e to 1512h may be disposed on the bottom of the antenna substrate 1511.

The PCB 1500 may include a plurality of layers 1511 to 1518. For example, the antenna module 1530 may be disposed on a surface of a first layer 1501.

The first layer 1501 and a second layer 1502 may be electrically connected to each other through the 1a-th via hole 1501a. An end of the 1a-th via hole 1501a may be electrically connected with a coupling pad 1501-1 of the first layer 1501.

The second layer 1502 and a seventeenth layer 1517 may be electrically connected through a coaxial plated through-hole 1540. The coaxial plated through-hole 1540 may include a coaxial feedline 1541 and a plated region 1542. The coaxial feedline 1541 may be disposed through the second to sixteenth layers 1502 to 1516. Among antennas 1532a to 1532h, an end of the coaxial feedline 1541 may be electrically connected with another end of the 1a-th via hole 1501a and with a seventh antenna 1532f. The plated region 1542 may be formed through the second layer 1502 to the sixteenth layer 1516 along the coaxial feedline 1541.

For example, the diameter of the coaxial plated through-hole 1540 may be 0.7 to 1 mm. For example, the diameter of the coaxial plated through-hole 1540 may be 0.8 mm. The diameter of the coaxial feedline 1541 may be 0.2 mm. The diameter of the coaxial feedline 1541 may be 0.175 mm. The diameter of the coaxial feedline 1541 may be 0.15 mm.

The sixteenth layer 1516 and the seventeenth layer 1517 may be electrically connected through the 16a-th via hole 1516a and the 16b-th via hole 1516b.

The 16a-th via hole 1516a and the 16b-th via hole 1516b may be electrically connected through a first conductive line 1516-1. For example, an end of the first conductive line 1516-1 may be electrically connected with an end of the 16a-th via hole 1516a. Another end of the first conductive line 1516-1 may be electrically connected with an end of the 16b-th via hole 1516b.

The seventeenth layer 1517 and the eighteenth layer 1518 may be electrically connected through a 17a-th via hole 1517a, a 17b-th via hole 1517b, and a 17c-th via hole 1517c. An end of the 17a-th via hole 1517a may be electrically connected with another end of the coaxial feedline 1541.

An end of the 17b-th via hole 1517b may be electrically connected with another end of the 16a-th via hole 1516a. An end of the 17c-th via hole 1517c may be electrically connected with another end of the 16b-th via hole 1516b.

Figure 16:
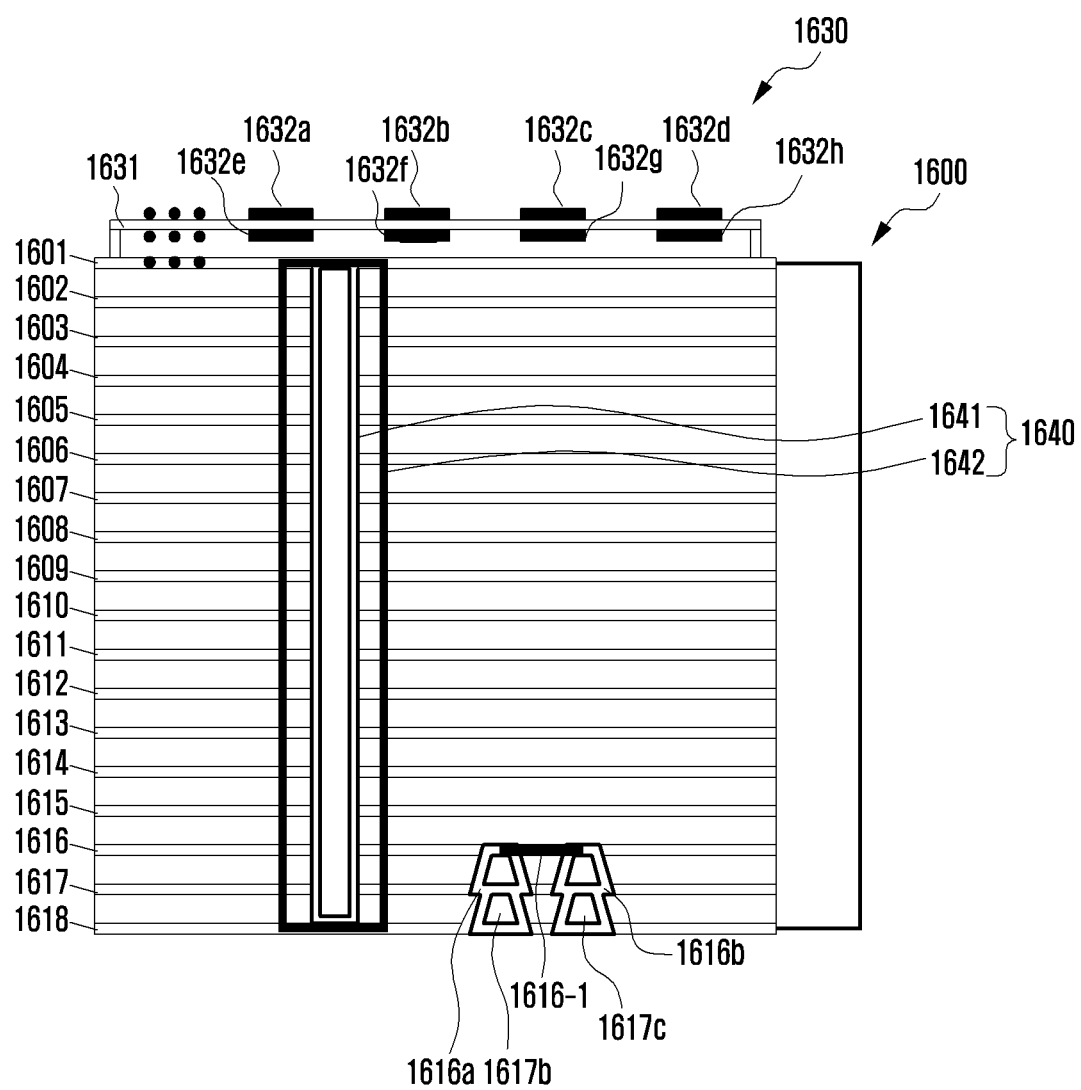
FIG. 16 is a cross-sectional view of an antenna module and a PCB according to an embodiment of the disclosure.

FIG. 16 is a cross-sectional view of an antenna module and a PCB according to an embodiment of the disclosure.

Referring to FIG. 16, an antenna module 1630 may be disposed on a surface of a PCB 1600. The antenna module 1630 may be the same as or similar to the antenna module 110 of FIG. 1. The PCB 1600 may be the same as or similar to the PCB 120 of FIG. 1.

The antenna module 1630 may include an antenna substrate 1610 and a plurality of antennas 1612a to 1612h. For example, a first antenna to a fourth antenna 1612a to 1612d may be disposed on the top of the antenna substrate 1611. The antenna substrate 1611 may be disposed on the top of the PCB 1600. A fifth antenna to an eighth antenna 1612e to 1612h may be disposed on the bottom of the antenna substrate 1611.

The PCB 1600 may include a plurality of layers 1611 to 1618. For example, the antenna module 1630 may be disposed on a surface of a first layer 1601.

The first layer 1601 and an eighteenth layer 1618 may be electrically connected through a coaxial plated through-hole 1640. The coaxial plated through-hole 1640 may include a coaxial feedline 1641 and a plated region 1642.

For example, the diameter of the coaxial plated through-hole 1640 may be 0.7 to 1 mm. For example, the diameter of the coaxial plated through-hole 1640 may be 0.8 mm. The diameter of the coaxial feedline 1641 may be 0.2 mm. The diameter of the coaxial feedline 1641 may be 0.175 mm. The diameter of the coaxial feedline 1641 may be 0.15 mm.

The sixteenth layer 1616 and the seventeenth layer 1617 may be electrically connected through a 16a-th via hole 1616a and a 16b-th via hole 1616b.

The 16a-th via hole 1616a and the 16b-th via hole 1616b may be electrically connected through a first conductive line 1616-1. For example, among antennas 1632a to 1632h, an end of the first conductive line 1616-1 may be electrically connected with an end of the 16a-th via hole 1616a and with a seventh antenna 1632f. Another end of the first conductive line 1616-1 may be electrically connected with an end of the 16b-th via hole 1616b.

The seventeenth layer 1617 and the eighteenth layer 1618 may be electrically connected through a 17a-th via hole 1617a, a 17b-th via hole 1617b, and a 17c-th via hole 1617c. An end of the 17a-th via hole 1617a may be electrically connected with another end of the coaxial feedline 1641.

An end of the 17b-th via hole 1617b may be electrically connected with another end of the 16a-th via hole 1616a. An end of the 17c-th via hole 1617c may be electrically connected with another end of the 16b-th via hole 1616b.

Figure 17:
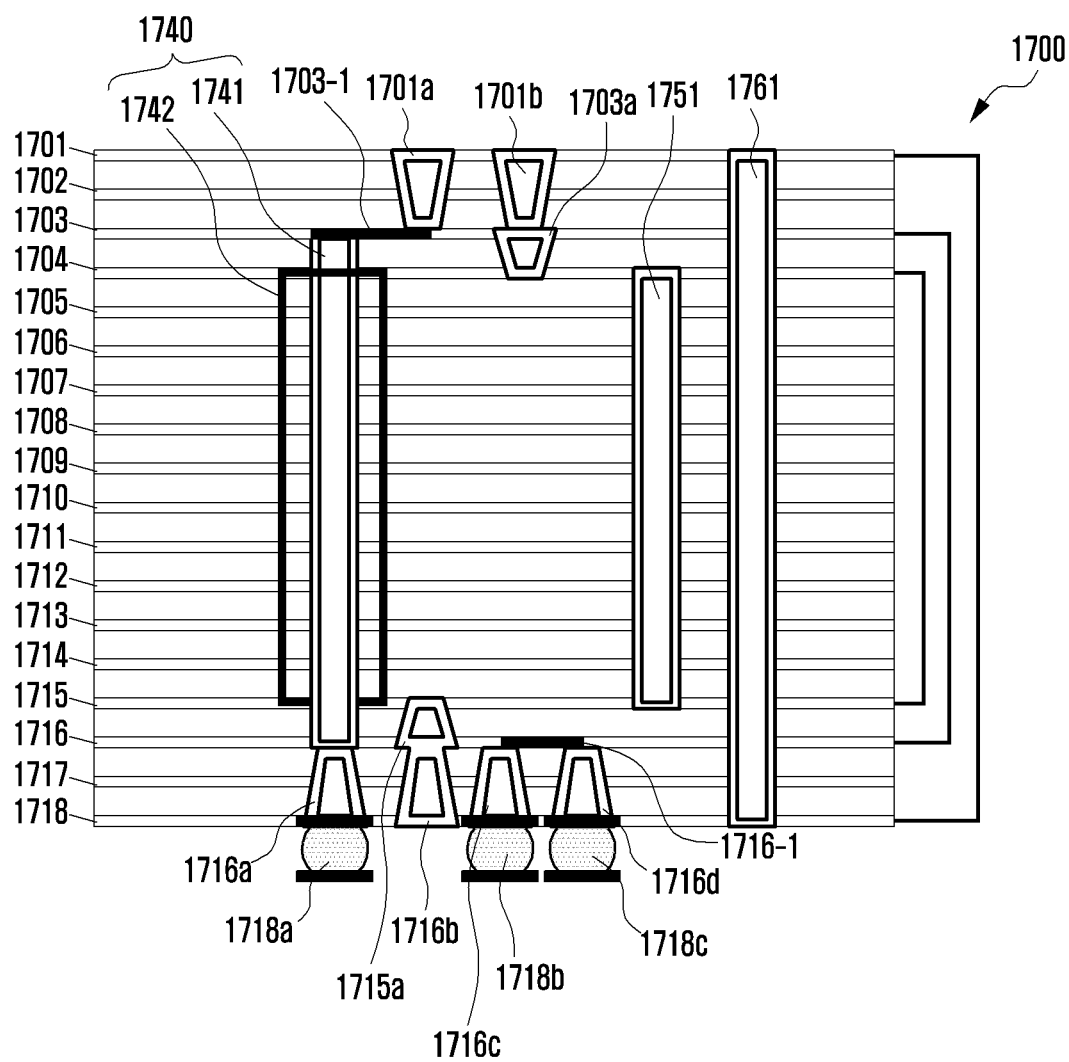
FIG. 17 is a cross-sectional view of a PCB according to an embodiment of the disclosure.

FIG. 17 is a cross-sectional view of a PCB according to an embodiment of the disclosure.

Referring to FIG. 17, a PCB 1700 may be the same as or similar to the PCB 120 of FIG. 1. For example, the PCB 1700 may include a plurality of layers 1711 to 1718. A first layer 1701 to a third layer 1703 may be electrically connected through a 1a-th via hole 1701*a* and a 1b-th via hole 1701*b*.

The third layer 1703 and the fourth layer 1704 may be electrically connected through a 3a-th via hole 1703*a*. An end of the 3a-th via hole 1703*a* may be electrically connected with the 1b-th via hole 1701*b*.

The third layer 1703 and a sixteenth layer 1716 may be electrically connected through a coaxial plated through-hole 1740. The coaxial plated through-hole 1740 may include a coaxial feedline 1741 and a plated region 1742. The coaxial feedline 1741 may be disposed through the fourth to fifteenth layers 1704 to 1715.

The third layer 1703 may include a first conductive line 1703-1. For example, an end of the first conductive line 1703-1 may be electrically connected with the 1a-th via hole 1701*a*. Another end of the first conductive line 1703-1 may be electrically connected with an end of the coaxial feedline 1741.

The plated region 1742 may be formed through the fourth layer 1704 to the fifteenth layer 1715 along the coaxial feedline 1741.

For example, the diameter of the coaxial plated through-hole 1740 may be 0.7 to 1 mm. For example, the diameter of the coaxial plated through-hole 1740 may be 0.8 mm. The diameter of the coaxial feedline 1741 may be 0.2 mm. The diameter of the coaxial feedline 1741 may be 0.175 mm. The diameter of the coaxial feedline 1741 may be 0.15 mm.

The fifteenth layer 1715 and the sixteenth layer 1716 may be electrically connected through a 15a-th via hole 1715*a*.

The sixteenth layer 1716 to the eighteenth layer 1718 may be electrically connected through a 16a-th via hole 1716*a*, a 16b-th via hole 1716*b*, a 16c-th via hole 1716*c*, and a 16d-th via hole 1716*d*.

An end of the 16a-th via hole 1716*a* may be electrically connected with another end of the coaxial feedline 1741. Another end of the 16a-th via hole 1716*a* may be electrically connected with a first ball 1715*a*.

An end of the 16b-th via hole 1716*b* may be electrically connected with the 15a-th via hole 1718*a*.

The sixteenth layer 1716 may include a first conductive line 1716-1. An end of the first conductive line 1716-1 may be electrically connected with an end of the 16c-th via hole 1716*c*. Another end of the first conductive line 1716-1 may be electrically connected with an end of the 16d-th via hole 1716*d*. Another end of the 16c-th via hole 1716*c* may be electrically connected with a second ball 1718*b*. Another end of the 16d-th via hole 1716*d* may be electrically connected with a third ball 1718*c*. The fourth layer 1704 to the fifteenth layer 1715 may be electrically connected through a through-hole 1751. The through-hole 1751 may be formed through the fourth to fifteenth layers 1704 to 1715. The first layer 1701 to the eighteenth layer 1718 may be electrically connected through a through-hole 1761. The through-hole 1761 may be formed through the first to eighteenth layers 1701 to 1718.

Figure 18:
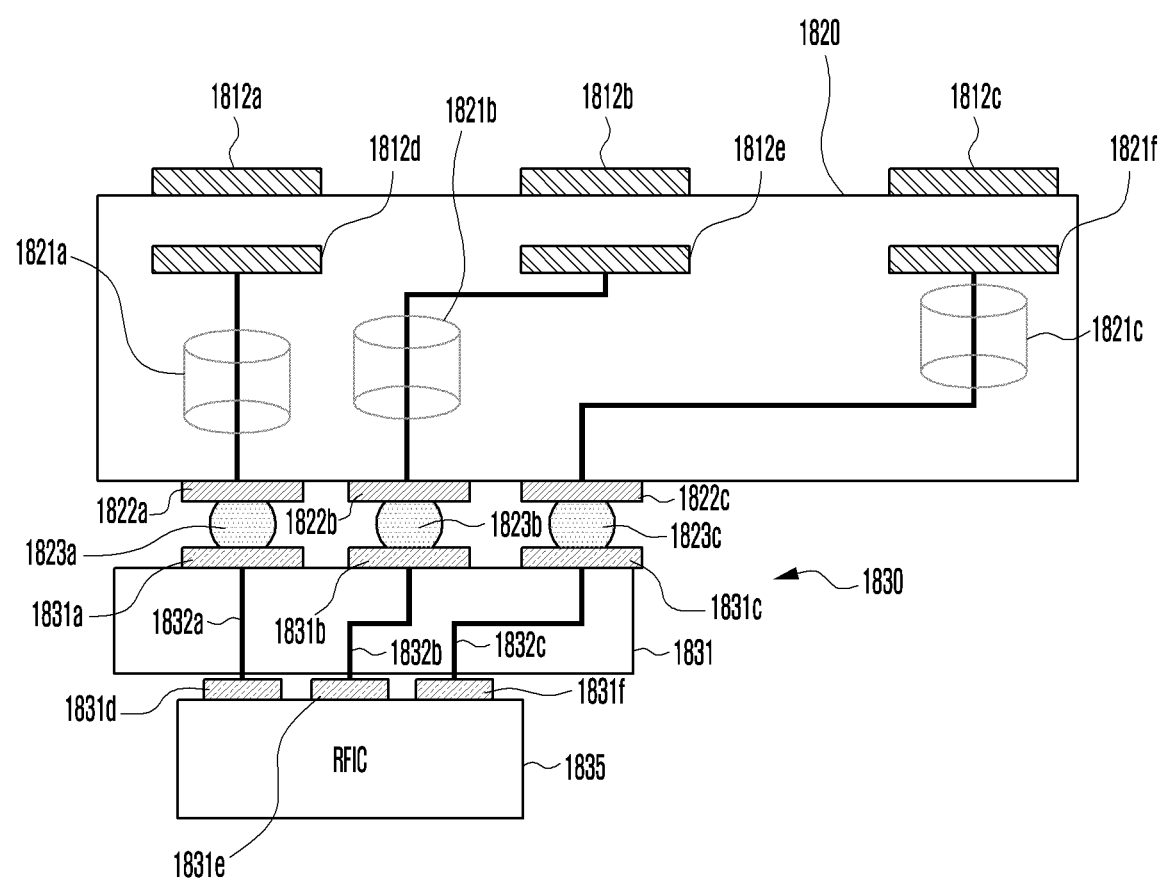
FIG. 18 is a cross-sectional view of an electronic apparatus according to an embodiment of the disclosure.

FIG. 18 is a cross-sectional view of an electronic apparatus according to an embodiment of the disclosure.

Referring to FIG. 18, an electronic apparatus 1800 may include a PCB 1820 and an RFIC module 1830.

The PCB 1820 may include a plurality of antennas 1812*a* to 1812*f*, a plurality of coaxial feedlines 1821*a* to 1821*c*, a plurality of electrode pads 1822*a* to 1822*c*, and a plurality of balls 1823*a* to 1823*c*.

For example, a first antenna 1812*a* to a third antenna 1812*c* may be mounted on a surface of the PCB 1820. A fourth antenna 1812*d* to a sixth antenna 1812*f* may be mounted in the PCB 1820. The electrode pads 1822*a* to 1822*c* may be disposed on another surface of the PCB 1820.

An end of a first coaxial feedline 1821*a* may be electrically connected with a fourth antenna 1812*d*. Another end of the first coaxial feedline 1821*a* may be electrically connected with a first electrode pad 1822*a*. The first electrode pad 1822*a* may be electrically connected with a first ball 1823*a*.

An end of a second coaxial feedline 1821*b* may be electrically connected with a fifth antenna 1812*e*. Another end of the second coaxial feedline 1821*b* may be electrically connected with a second electrode pad 1822*b*. The second electrode pad 1822*b* may be electrically connected with a second ball 1823*b*.

An end of a third coaxial feedline 1821*c* may be electrically connected with a sixth antenna 1812*f*. Another end of the third coaxial feedline 1821*c* may be electrically connected with a third electrode pad 1822*c*. The third electrode pad 1822*c* may be electrically connected with a third ball 1823*c*.

The RFIC module 1830 may include a package 1831 and an RFIC 1835. The package 1831 may include a plurality of electrode pads 1831*a* to 1831*f* and a plurality of conductive lines 1832*a* to 1832*c*.

A first electrode pad to a third electrode pad 1831*a* to 1832*c* may be disposed on a surface of the package 1831. A fourth electrode pad to a sixth electrode pad 1831*d* to 1831*f* may be disposed on another surface of the package 1831.

An end of a first conductive line 1832*a* may be electrically connected with a first electrode pad 1831*a*. Another end of the first conductive line 1832*a* may be electrically connected with a fourth electrode pad 1831*d*. An end of a second conductive line 1832*b* may be electrically connected with a second electrode pad 1831*b*. Another end of the second conductive line 1832*b* may be electrically connected with a fifth electrode pad 1831*e*. An end of a third conductive line 1832*c* may be electrically connected with a third electrode pad 1831*c*. Another end of the third conductive line 1832*c* may be electrically connected with a sixth electrode pad 1831*f*.

Another end of the fourth electrode pad 1831*d* may be electrically connected with the RFIC 1835. Another end of the fifth electrode pad 1831*e* may be electrically connected with the RFIC 1835. Another end of the sixth electrode pad 1831*f* may be electrically connected with the RFIC 1835.

Figure 19:
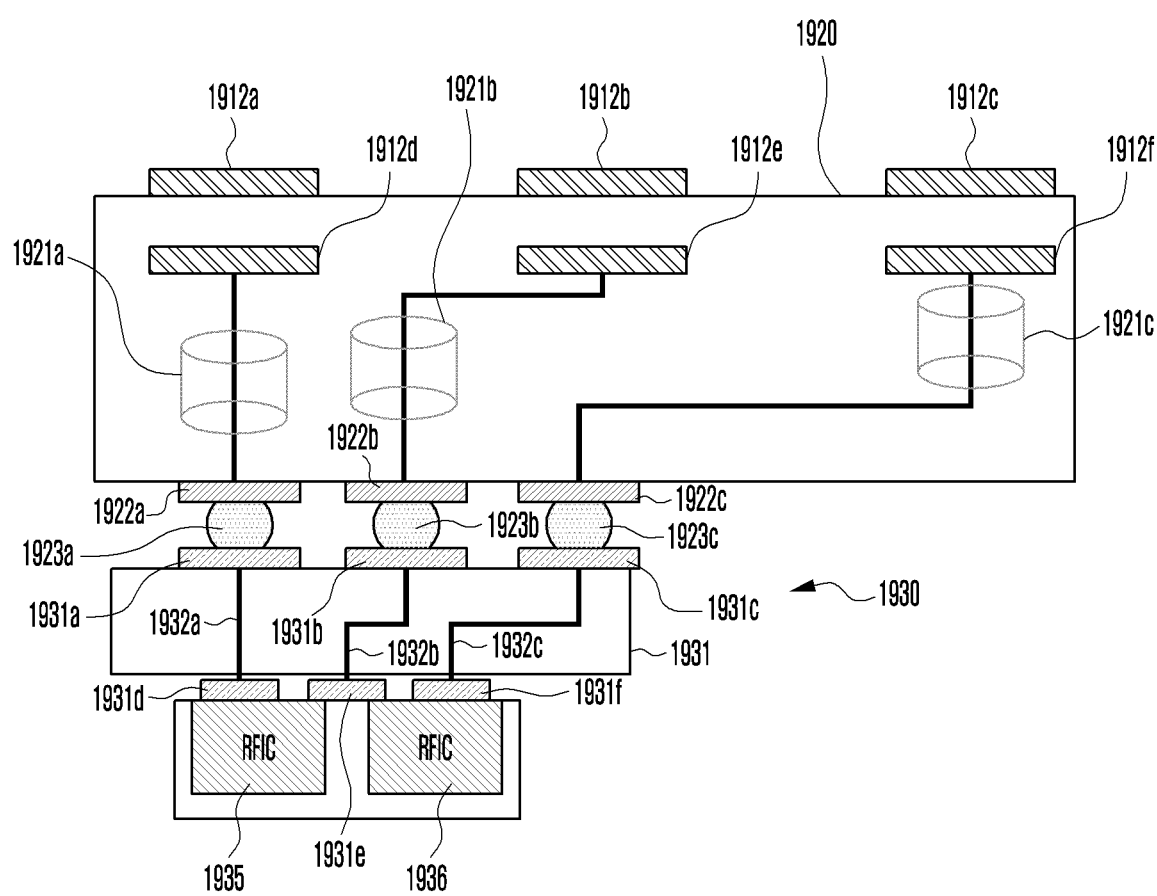
FIG. 19 is a cross-sectional view of an electronic apparatus according to an embodiment of the disclosure.

FIG. 19 is a cross-sectional view of an electronic apparatus according to an embodiment of the disclosure.

Referring to FIG. 19, an electronic apparatus 1900 may include a PCB 1920 and an RFIC module 1930.

The PCB 1920 may include a plurality of antennas 1912*a* to 1912*f*, a plurality of coaxial feedlines 1921*a* to 1921*c*, a plurality of electrode pads 1922*a* to 1922*c*, and a plurality of balls 1923*a* to 1923*c*.

For example, a first antenna 1912*a* to a third antenna 1912*c* may be mounted on a surface of the PCB 1920. A fourth antenna 1912*d* to a sixth antenna 1912*f* may be mounted in the PCB 1920. The electrode pads 1922*a* to 1922*c* may be disposed on another surface of the PCB 1920.

An end of a first coaxial feedline 1921*a* may be electrically connected with a fourth antenna 1912*d*. Another end of the first coaxial feedline 1921*a* may be electrically connected with a first electrode pad 1922*a*. The first electrode pad 1922*a* may be electrically connected with a first ball 1923*a*.

An end of a second coaxial feedline 1921*b* may be electrically connected with a fifth antenna 1812*e*. Another end of the second coaxial feedline 1921*b* may be electrically connected with a second electrode pad 1922b. The second electrode pad 1922b may be electrically connected with a second ball 1923b.

An end of a third coaxial feedline 1921c may be electrically connected with a sixth antenna 1912f. Another end of the third coaxial feedline 1921c may be electrically connected with a third electrode pad 1922c. The third electrode pad 1922c may be electrically connected with a third ball 1923c.

The RFIC module 1930 may be a System-in-Package (SiP) including a plurality of RFICs. For example, the RFIC module 1930 may include a package 1931, a first RFIC 1935, and a second RFIC 1936. The package 1931 may include a plurality of electrode pads 1931a to 1931f and a plurality of conductive lines 1932a to 1932c.

A first electrode pad to a third electrode pad 1931a to 1932c may be disposed on a surface of the package 1931. A fourth electrode pad to a sixth electrode pad 1931d to 1931f may be disposed on another surface of the package 1931.

An end of a first conductive line 1932a may be electrically connected with a first electrode pad 1931a. Another end of the first conductive line 1932a may be electrically connected with a fourth electrode pad 1931d. An end of a second conductive line 1932b may be electrically connected with a second electrode pad 1931b. Another end of the second conductive line 1932b may be electrically connected with a fifth electrode pad 1931e. An end of a third conductive line 1932c may be electrically connected with a third electrode pad 1931c. Another end of the third conductive line 1932c may be electrically connected with a sixth electrode pad 1931f.

Another end of the fourth electrode pad 1931d may be electrically connected with the first RFIC 1935. Another end of the fifth electrode pad 1931e may be electrically connected with the first RFIC 1935. Another end of the sixth electrode pad 1931f may be electrically connected with the second RFIC 1936.

Figure 20:
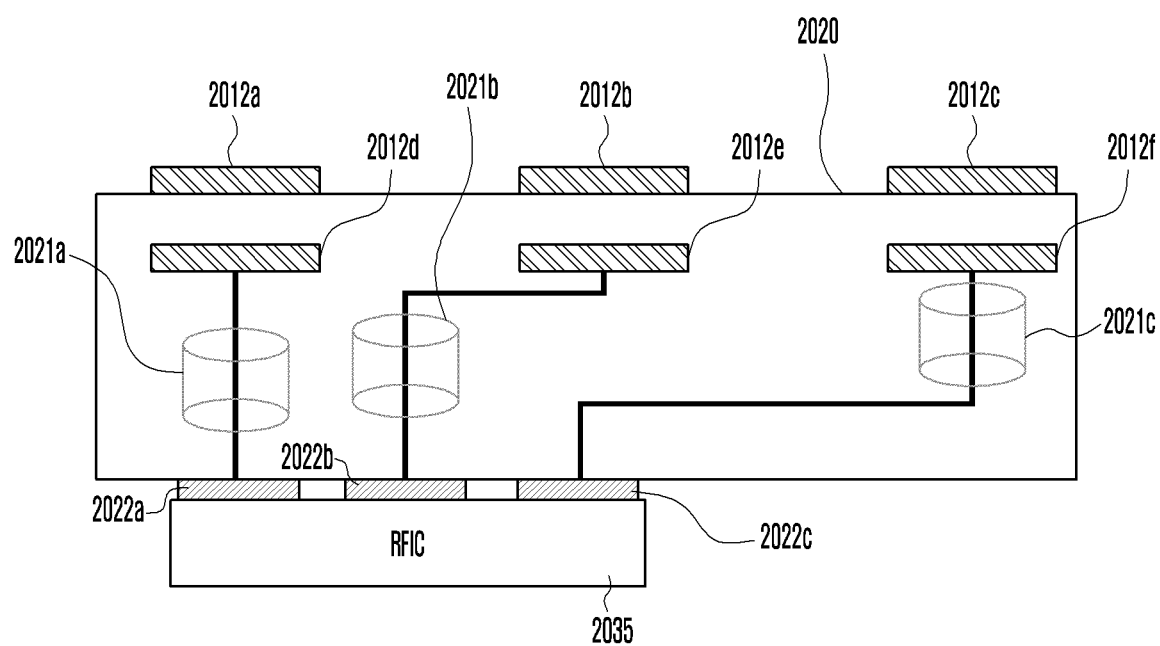
FIG. 20 is a cross-sectional view of an electronic apparatus according to an embodiment of the disclosure.

FIG. 20 is a cross-sectional view of an electronic apparatus according to an embodiment of the disclosure.

Referring to FIG. 20, an electronic apparatus 2000 may include a PCB 2020 and an RFIC module 2030.

The PCB 2020 may include a plurality of antennas 2012a to 2012f, a plurality of coaxial feedlines 2021a to 2021c, a plurality of electrode pads 2022a to 2022c, and a plurality of balls 2023a to 2023c.

For example, a first antenna 2012a to a third antenna 2012c may be mounted on a surface of the PCB 2020. A fourth antenna 2012d to a sixth antenna 2012f may be mounted in the PCB 2020. The electrode pads 2022a to 2022c may be disposed on another surface of the PCB 2020.

An end of a first coaxial feedline 2021a may be electrically connected with a fourth antenna 2012d. Another end of the first coaxial feedline 2021a may be electrically connected with an end of a first electrode pad 2022a.

An end of a second coaxial feedline 2021b may be electrically connected with a fifth antenna 2012e. Another end of the second coaxial feedline 2021b may be electrically connected with an end of a second electrode pad 2022b.

An end of a third coaxial feedline 2021c may be electrically connected with a sixth antenna 2012f. Another end of the third coaxial feedline 2021c may be electrically connected with an end of a third electrode pad 2022c.

The RFIC module 2030 may include an RFIC 2035. Another end of the first electrode 2022a may be electrically connected with the RFIC 2035. Another end of the second electrode pad 2022b may be electrically connected with the RFIC 2035. Another end of the third electrode pad 2022c may be electrically connected with the RFIC 2035.

Figure 21:
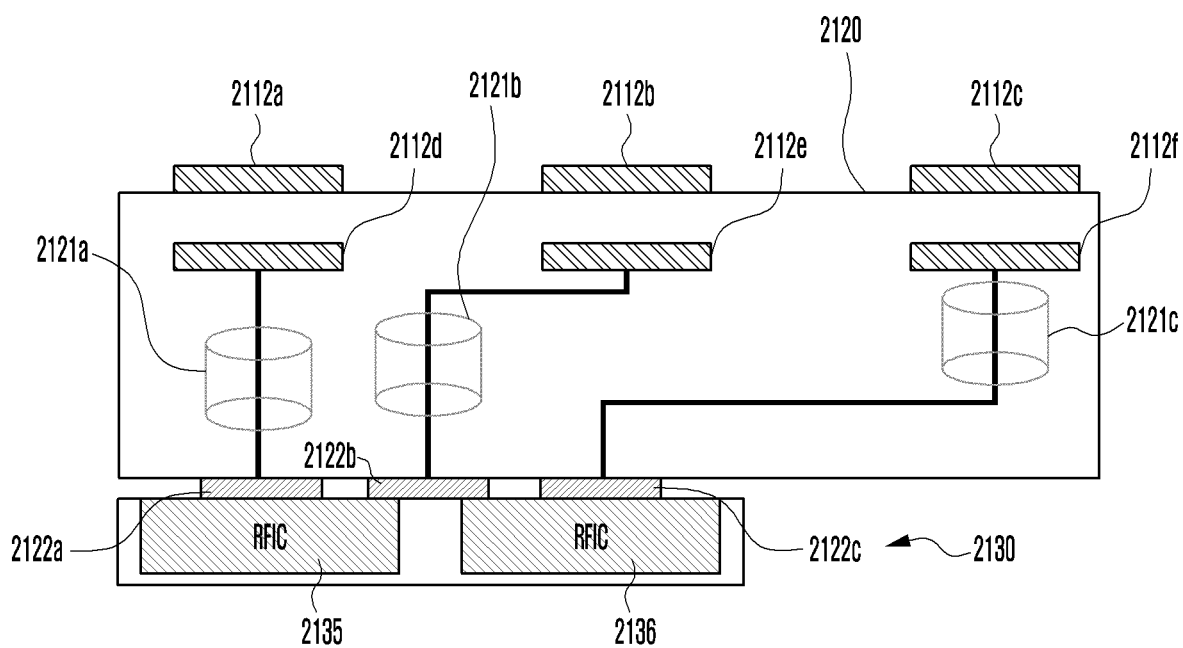
FIG. 21 is a cross-sectional view of an electronic apparatus according to an embodiment of the disclosure.

FIG. 21 is a cross-sectional view of an electronic apparatus according to an embodiment of the disclosure.

Referring to FIG. 21, an electronic apparatus 2100 may include a PCB 2120 and an RFIC module 2130.

The PCB 2120 may include a plurality of antennas 2112a to 2112f, a plurality of coaxial feedlines 2121a to 2121c, a plurality of electrode pads 2122a to 2122c, and a plurality of balls 2123a to 2123c.

For example, a first antenna 2112a to a third antenna 2112c may be mounted on a surface of the PCB 2120. A fourth antenna 2112d to a sixth antenna 2112f may be mounted in the PCB 2120. The electrode pads 2122a to 2122c may be disposed on another surface of the PCB 2120.

An end of a first coaxial feedline 2121a may be electrically connected with a fourth antenna 2112d. Another end of the first coaxial feedline 2121a may be electrically connected with an end of a first electrode pad 2122a.

An end of a second coaxial feedline 2121b may be electrically connected with a fifth antenna 2112e. Another end of the second coaxial feedline 2121b may be electrically connected with an end of a second electrode pad 2122b.

An end of a third coaxial feedline 2121c may be electrically connected with a sixth antenna 2112f. Another end of the third coaxial feedline 2121c may be electrically connected with an end of a third electrode pad 2122c.

The RFIC module 2130 may be a System-in-Package (SiP) including a plurality of RFICs. For example, the RFIC module 2130 may include a first RFIC 2135 and a second RFIC 2136. Another end of the fifth electrode pad 2122e may be electrically connected with the first RFIC 2135. Another end of the second electrode pad 2122b may be electrically connected with the first RFIC 2135. Another end of the third electrode pad 2122c may be electrically connected with the second RFIC 2136.

Figure 22:
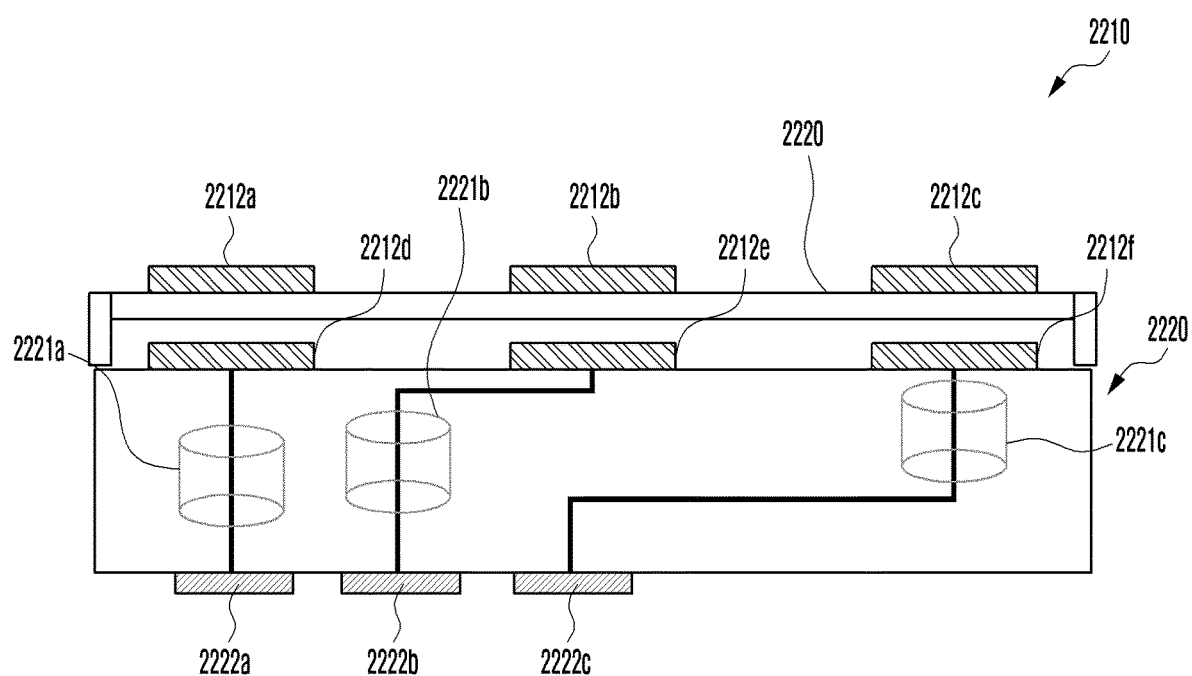
FIG. 22 is a cross-sectional view of an electronic apparatus according to an embodiment of the disclosure.

FIG. 22 is a cross-sectional view of an electronic apparatus according to an embodiment of the disclosure.

Referring to FIG. 22, an electronic apparatus 2200 may include an antenna module 2210 and a PCB 2220.

The antenna module 2210 may be mounted on a surface of the PCB 2220. The antenna module 2210 may include an antenna substrate 2211 and a plurality of antennas 2212a to 2212f. For example, a first antenna to a third antenna 2212a to 2212c may be disposed on the top of the antenna substrate 2211. The antenna substrate 2211 may be disposed on the top of the PCB 2220. A fourth antenna to a sixth antenna 2212d to 2212f may be disposed on the top of the PCB 2220.

The PCB 2120 may include a plurality of coaxial feedlines 2221a to 2221c and a plurality of electrode pads 2222a to 2222c.

An end of a first coaxial feedline 2221a may be electrically connected with a fourth antenna 2212d. Another end of the first coaxial feedline 2221a may be electrically connected with an end of a first electrode pad 2222a.

An end of a second coaxial feedline 2221b may be electrically connected with a fifth antenna 2212e. Another end of the second coaxial feedline 2221b may be electrically connected with an end of a second electrode pad 2222b.

An end of a third coaxial feedline 2221c may be electrically connected with a sixth antenna 2212f. Another end of the third coaxial feedline 2221c may be electrically connected with an end of a third electrode pad 2222c.

Figure 23:
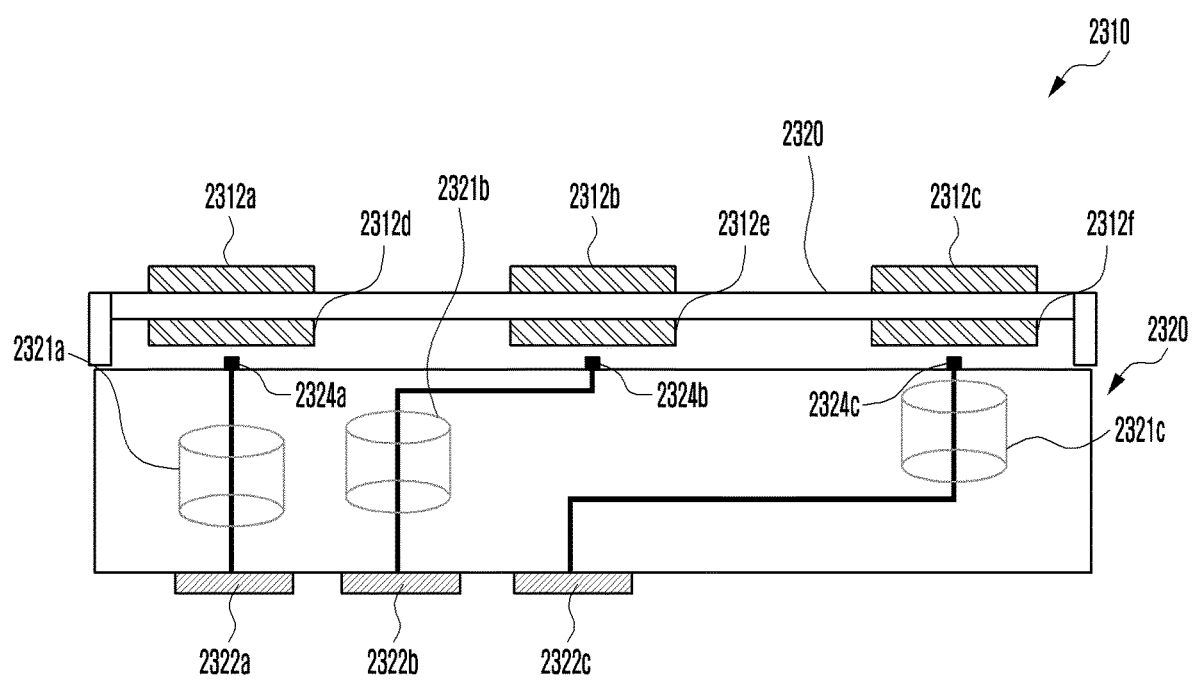
FIG. 23 is a cross-sectional view of an electronic apparatus according to an embodiment of the disclosure.

FIG. 23 is a cross-sectional view of an electronic apparatus according to an embodiment of the disclosure.

Referring to FIG. 23, an electronic apparatus 2300 may include an antenna module 2310 and a PCB 2320.

The antenna module 2310 may be mounted on a surface of the PCB 2320. The antenna module 2310 may include an antenna substrate 2311 and a plurality of antennas 2312a to 2312f. For example, a first antenna to a third antenna 2312a to 2312c may be disposed on the top of the antenna substrate 2311. A fourth antenna to a sixth antenna 2312d to 2312f may be disposed on the bottom of the antenna substrate 2311. The antenna substrate 2311 may be disposed on the top of the PCB 2320.

The PCB 2320 may include a plurality of coaxial feedlines 2321a to 2321c, a plurality of electrode pads 2322a to 2322c, and a plurality of coupling pads 2342a to 2342c.

An end of a first coaxial feedline 2321a may be electrically connected with a first coupling pad 2342a. Another end of the first coaxial feedline 2321a may be electrically connected with an end of a first electrode pad 2322a.

Another end of a second coaxial feedline 2321b may be electrically connected with a second coupling pad 2342b. Another end of the second coaxial feedline 2321b may be electrically connected with an end of a second electrode pad 2322b.

Another end of a third coaxial feedline 2321c may be electrically connected with a third coupling pad 2342c. Another end of the third coaxial feedline 2321c may be electrically connected with an end of a third electrode pad 2322c.

Figure 24:
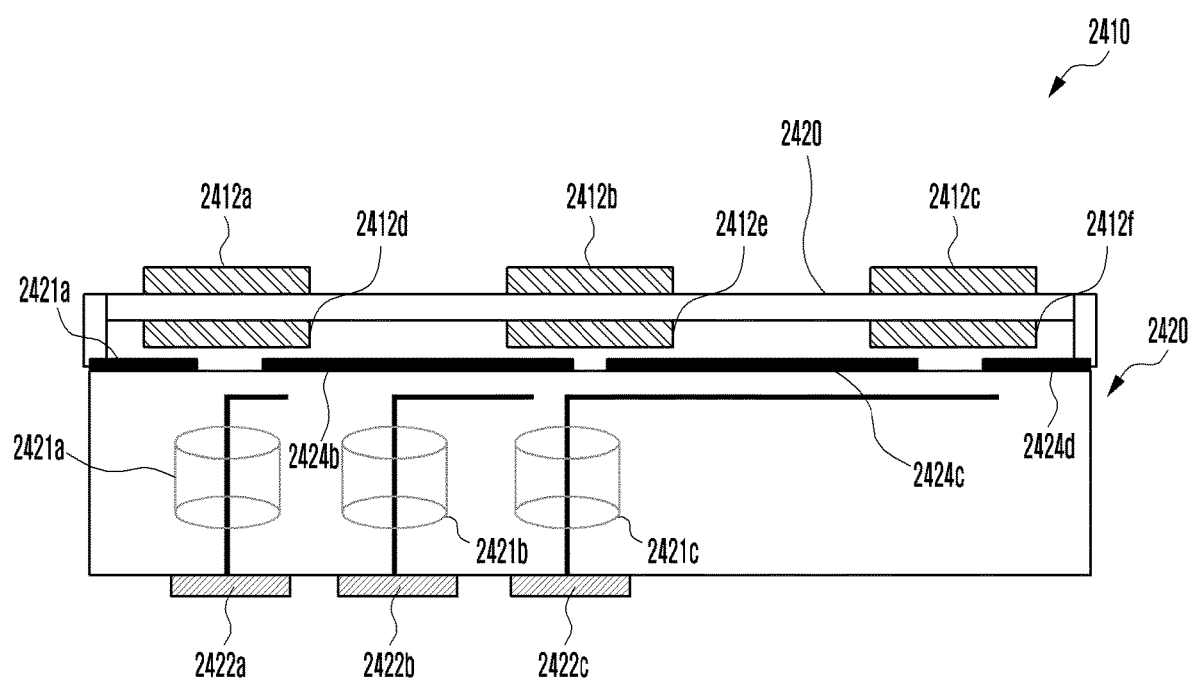
FIG. 24 is a cross-sectional view of an electronic apparatus according to an embodiment of the disclosure.

FIG. 24 is a cross-sectional view of an electronic apparatus according to an embodiment of the disclosure.

Referring to FIG. 24, an electronic apparatus 2400 may include and antenna module 2410 and a PCB 2420.

The antenna module 2410 may be mounted on a surface of the PCB 2420. The antenna module 2410 may include an antenna substrate 2411 and a plurality of antennas 2412a to 2412f. For example, a first antenna to a third antenna 2412a to 2412c may be disposed on the top of the antenna substrate 2411. A fourth antenna to a sixth antenna 2412d to 2412f may be disposed on the bottom of the antenna substrate 2411. The antenna substrate 2411 may be disposed on the top of the PCB 2420.

The PCB 2420 may include a plurality of coaxial feedlines 2421a to 2421c, a plurality of electrode pads 2422a to 2422c, and a plurality of coupling pads 2442a to 2442d.

A side of a first coaxial feedline 2421a may bend a predetermined angle in advance. For example, a side of the first coaxial feedline 2421a may be electromagnetically coupled to at least one of the coupling pads 2442a to 2442d. Another end of the first coaxial feedline 2421a may be electrically connected with a first electrode pad 2422a.

A side of a second coaxial feedline 2421b may bend a predetermined angle in advance. For example, a side of the second coaxial feedline 2421b may be electromagnetically coupled to at least one of the coupling pads 2442a to 2442d. Another end of the second coaxial feedline 2421b may be electrically connected with a second electrode pad 2422b.

A side of a third coaxial feedline 2421c may bend a predetermined angle in advance. For example, a side of the third coaxial feedline 2421c may be electromagnetically coupled to at least one of the coupling pads 2442a to 2442d. Another end of the third coaxial feedline 2421c may be electrically connected with a third electrode pad 2422c.

Figure 25:
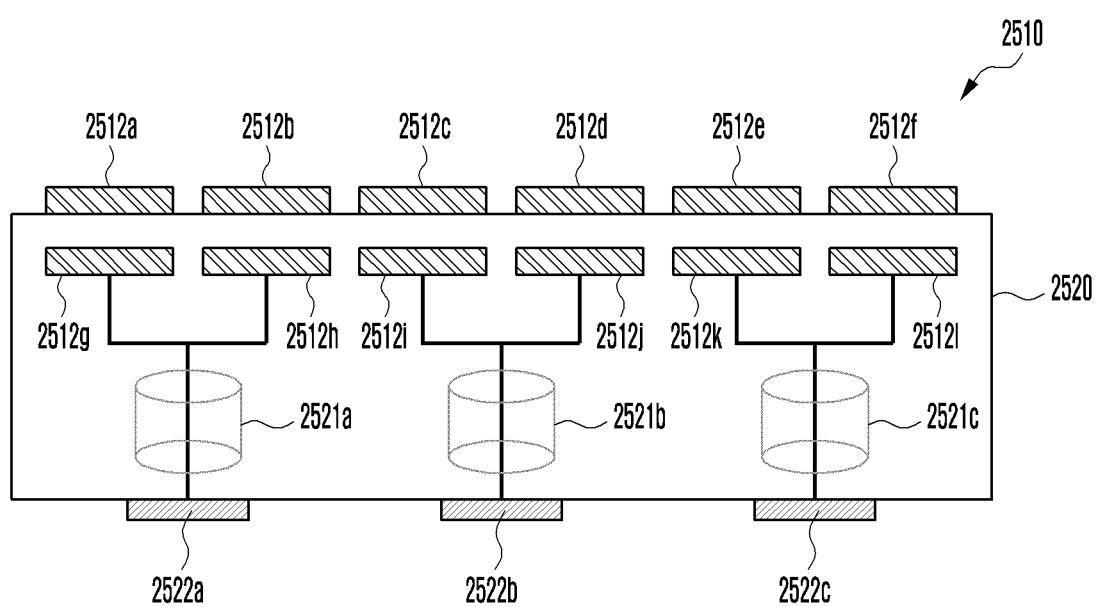
FIG. 25 is a cross-sectional view of an electronic apparatus according to an embodiment of the disclosure.

FIG. 25 is a cross-sectional view of an electronic apparatus according to an embodiment of the disclosure.

Referring to FIG. 25, the electronic apparatus 2500 may include a PCB 2520. The PCB 2520 may include a plurality of antennas 2521a to 2512l, a plurality of coaxial feedlines 2521a to 2521c, and a plurality of electrode pads 2522a to 2522c.

For example, a first antenna to a sixth antenna 2512a to 2512f may be disposed on the top of the PCB 2520. A seventh antenna to a twelfth antenna 2412g to 2412l may be disposed in the PCB 2520.

A side of a first coaxial feedline 2521a may be divided into two lines. For example, a first line at a side of the first coaxial feedline 2521a may be electrically connected with a seventh antenna 2512g. A second line at the side of the first coaxial feedline 2521a may be electrically connected with an eighth antenna 2512h. Another end of the first coaxial feedline 2521a may be electrically connected with a first electrode pad 2522a.

A side of a second coaxial feedline 2521b may be divided into two lines. For example, a first line at a side of the second coaxial feedline 2521b may be electrically connected with a ninth antenna 2512i. A second line at the side of the second coaxial feedline 2521b may be electrically connected with a tenth antenna 2512j. Another end of the second coaxial feedline 2521b may be electrically connected with a second electrode pad 2522b.

A side of a third coaxial feedline 2521c may be divided into two lines. For example, a first line at a side of the third coaxial feedline 2521c may be electrically connected with an eleventh antenna 2512k. A second line at the side of the third coaxial feedline 2521c may be electrically connected with a twelfth antenna 2512l. Another end of the third coaxial feedline 2521c may be electrically connected with a third electrode pad 2522c.

Figure 26:
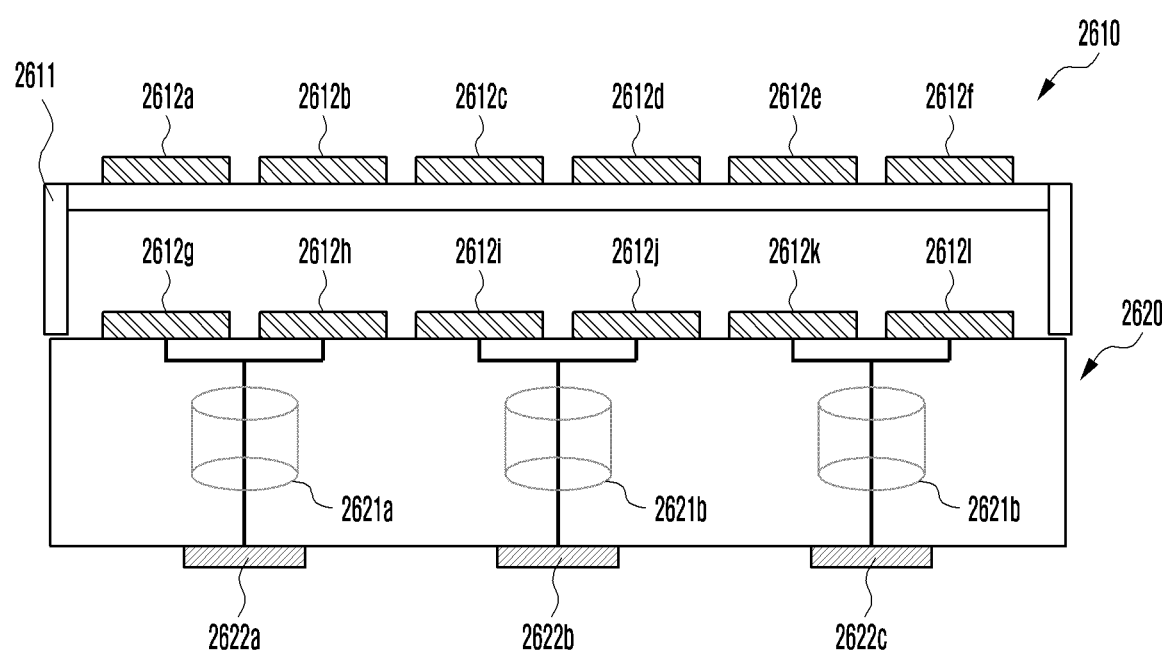
FIG. 26 is a cross-sectional view of an electronic apparatus according to an embodiment of the disclosure.

FIG. 26 is a cross-sectional view of an electronic apparatus according to an embodiment of the disclosure.

Referring to FIG. 26, an electronic apparatus 2600 may include an antenna module 2610 and a PCB 2620.

The antenna module 2610 may be mounted on a surface of the PCB 2620. The antenna module 2610 may include an antenna substrate 2611 and a plurality of antennas 2612a to 2612l. For example, a first antenna to a sixth antenna 2612a to 2612f may be disposed on the top of the antenna substrate 2611. A seventh antenna to a twelfth antenna 2612g to 2612l may be disposed on the top of the PCB 2620. The antenna substrate 2611 may be disposed on the top of the PCB 2620.

The PCB 2620 may include a plurality of coaxial feedlines 2621a to 2621c and a plurality of electrode pads 2622a to 2622c.

A side of a first coaxial feedline 2621a may be divided into two lines. For example, a first line at a side of the first coaxial feedline 2621a may be electrically connected with a seventh antenna 2612g. A second line at the side of the first coaxial feedline 2621a may be electrically connected with an eighth antenna 2612h. Another end of the first coaxial feedline 2621a may be electrically connected with a first electrode pad 2622a.

A side of a second coaxial feedline 2621b may be divided into two lines. For example, a first line at a side of the second coaxial feedline 2621b may be electrically connected with a ninth antenna 2612i. A second line at the side of the second coaxial feedline 2621b may be electrically connected with a tenth antenna 2612j. Another end of the second coaxial feedline 2621b may be electrically connected with a second electrode pad 2622b.

A side of a third coaxial feedline 2621c may be divided into two lines. For example, a first line at a side of the third coaxial feedline 2621c may be electrically connected with an eleventh antenna 2612k. A second line at the side of the third coaxial feedline 2621c may be electrically connected with a twelfth antenna 2612l. Another end of the third coaxial feedline 2621c may be electrically connected with a third electrode pad 2622c.

Figure 27:
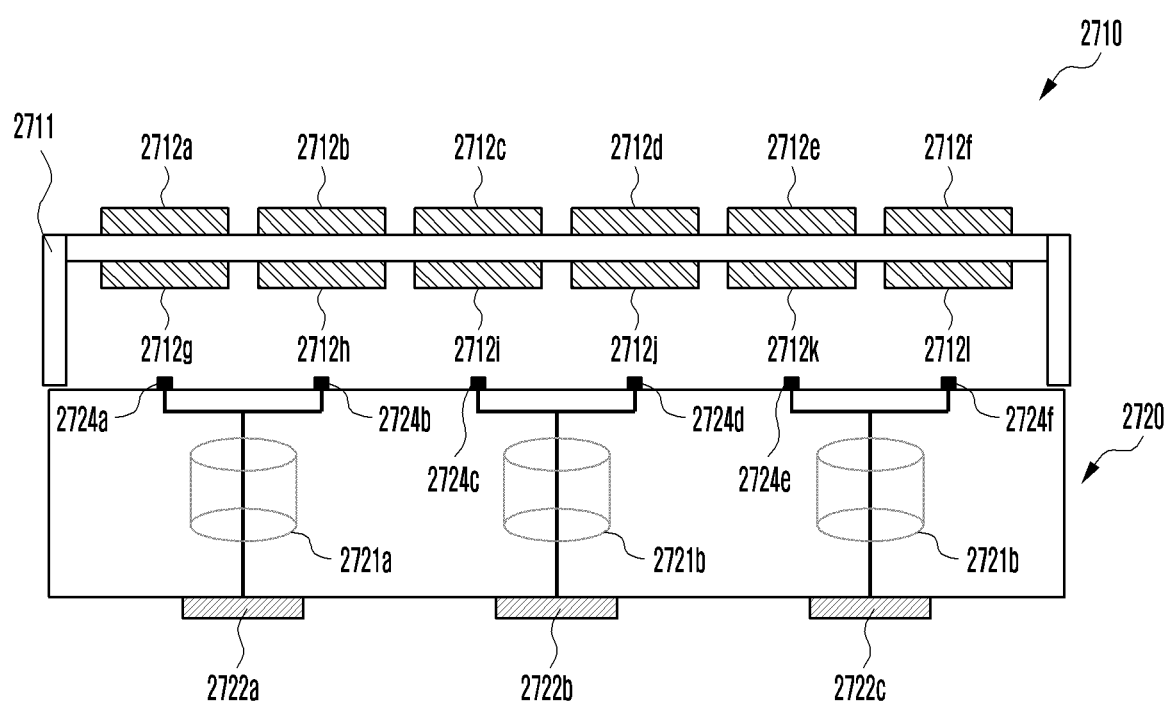
FIG. 27 is a cross-sectional view of an electronic apparatus according to an embodiment of the disclosure.

FIG. 27 is a cross-sectional view of an electronic apparatus according to an embodiment of the disclosure.

Referring to FIG. 27, an electronic apparatus 2700 may include an antenna module 2710 and a PCB 2720.

The antenna module 2710 may be mounted on a surface of the PCB 2720. The antenna module 2710 may include an antenna substrate 2711 and a plurality of antennas 2712a to 2712l. For example, a first antenna to a sixth antenna 2712a to 2712f may be disposed on the top of the antenna substrate 2711. A seventh antenna to a twelfth antenna 2712g to 2712l may be disposed on the bottom of the antenna substrate 2711. The antenna substrate 2711 may be disposed on the top of the PCB 2720.

The PCB 2720 may include a plurality of coaxial feedlines 2721a to 2721c, a plurality of electrode pads 2722a to 2722c, and a plurality of coupling pads 2724a to 2724f.

A side of a first coaxial feedline 2721a may be divided into two lines. For example, a first line at a side of the first coaxial feedline 2721a may be electrically connected with a first coupling pad 2724a. A second line at the side of the first coaxial feedline 2721a may be electrically connected with a second coupling pad 2724b. Another end of the first coaxial feedline 2721a may be electrically connected with a first electrode pad 2722a.

A side of a second coaxial feedline 2721b may be divided into two lines. For example, a first line at a side of the second coaxial feedline 2721b may be electrically connected with a third coupling pad 2724c. A second line at the side of the second coaxial feedline 2721b may be electrically connected with a fourth coupling pad 2724d. Another end of the second coaxial feedline 2721b may be electrically connected with a second electrode pad 2722b.

A side of a third coaxial feedline 2721c may be divided into two lines. For example, a first line at a side of the third coaxial feedline 2721c may be electrically connected with a fifth coupling pad 2724e. A second line at the side of the third coaxial feedline 2721c may be electrically connected with a sixth coupling pad 2724f. Another end of the third coaxial feedline 2721c may be electrically connected with a third electrode pad 2722c.

Figure 28:
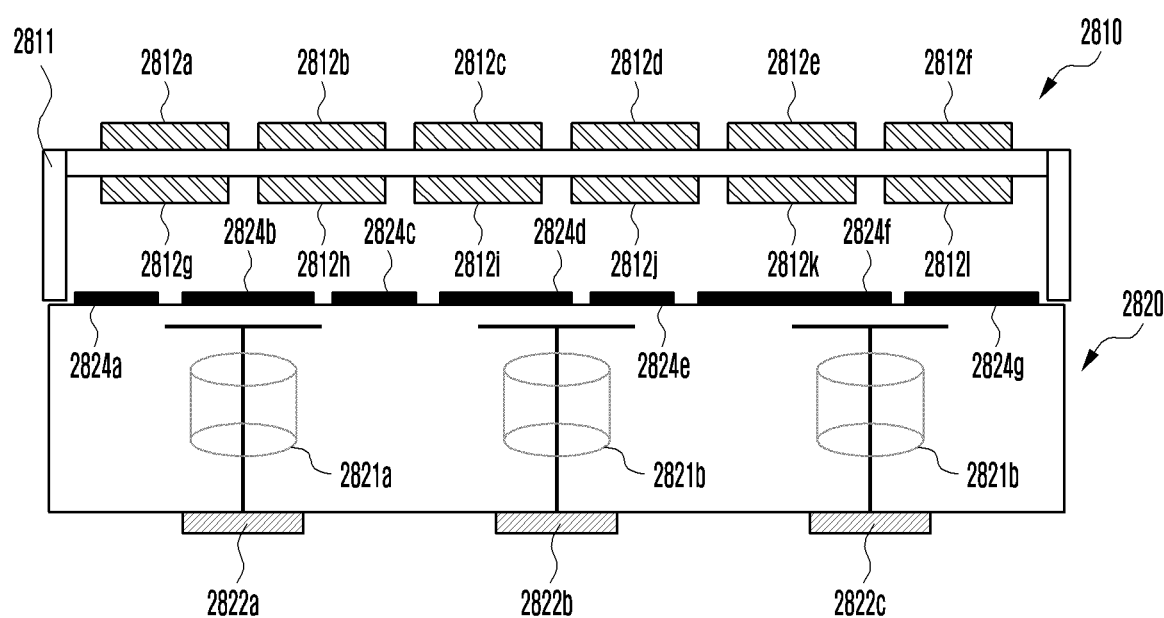
FIG. 28 is a cross-sectional view of an electronic apparatus according to an embodiment of the disclosure.

FIG. 28 is a cross-sectional view of an electronic apparatus according to an embodiment of the disclosure.

Referring to FIG. 28, an electronic apparatus 2800 may include an antenna module 2810 and a PCB 2820.

The antenna module 2810 may be mounted on a surface of the PCB 2820. The antenna module 2810 may include an antenna substrate 2811 and a plurality of antennas 2812a to 2812l. For example, a first antenna to a sixth antenna 2812a to 2812f may be disposed on the top of the antenna substrate 2811. A seventh antenna to a twelfth antenna 2812g to 2812l may be disposed on the bottom of the antenna substrate 2811. The antenna substrate 2811 may be disposed on the top of the PCB 2820.

The PCB 2820 may include a plurality of coaxial feedlines 2821a to 2821c, a plurality of electrode pads 2822a to 2822c, and a plurality of coupling pads 2824a to 2824g.

A side of a first coaxial feedline 2821a may be divided into two lines. For example, a first line and a second line at a side of the first coaxial feedline 2821a may bend a predetermined angle. The first line and the second line at the side of the first coaxial feedline 2821a may be electromagnetically coupled to at least one of the coupling pads 2824a to 2824g. Another end of the first coaxial feedline 2821a may be electrically connected with a first electrode pad 2822a.

A side of a second coaxial feedline 2821b may be divided into two lines. For example, a first line and a second line at a side of the second coaxial feedline 2821b may bend a predetermined angle. The first line and the second line at the side of the second coaxial feedline 2821b may be electromagnetically coupled to at least one of the coupling pads 2824a to 2824g. Another end of the second coaxial feedline 2821b may be electrically connected with a second electrode pad 2822b.

A side of a third coaxial feedline 2821c may be divided into two lines. For example, a first line and a second line at a side of the third coaxial feedline 2821c may bend a predetermined angle. The first line and the second line at the side of the third coaxial feedline 2821c may be electromagnetically coupled to at least one of the coupling pads 2824a to 2824g. Another end of the third coaxial feedline 2821c may be electrically connected with a third electrode pad 2822c.

While the disclosure has been shown and described with reference to various embodiments thereof, it will be understood by those skilled in the art that various changes in form and details may be made therein without departing from the spirit and scope of the disclosure as defined by the appended claims and their equivalents

What is claimed is:
1. A base station comprising:
a printed circuit board (PCB) including a plurality of layers, the plurality of layers including a first layer to a sixteenth layer;
an antenna module mounted on a surface of the PCB; and
a radio frequency integrated circuit (RFIC) module including a package and an RFIC, the RFIC module being mounted on another surface of the PCB,
wherein the PCB includes a coaxial plated through-hole (PTH) electrically connected with the antenna module and the RFIC,
wherein the coaxial PTH includes a coaxial feedline and a plated region,
wherein the coaxial feedline is formed through layers starting from a second layer to a fifteenth layer,
wherein the plated region is formed through layers starting from a third layer to a fourteenth layer and surrounds the coaxial feedline,
wherein a diameter of the coaxial PTH is 0.7 to 1 mm,
wherein a diameter of the coaxial feedline is 0.15 to 0.2 mm,
wherein a fourth to a thirteenth layers are made of a Flame Retardant type-4 (FR-4) material, and
wherein the first to the third layers and the fourteenth to the sixteenth layers are made of a material having a dissipation factor lower than a dissipation factor of the FR-4 material.
2. The base station of claim 1,
wherein the PCB further includes a first via hole disposed between the first layer and the second layer,
wherein an end of the first via hole is electrically connected with the antenna module, and
wherein another end of the first via hole is electrically connected with an end of the coaxial feedline.
3. The base station of claim 2,
wherein the PCB further includes a first conductive line disposed in the second layer,
wherein an end of the first conductive line is electrically connected with the first via hole, and
wherein another end of the first conductive line is electrically connected with the coaxial feedline.

4. The base station of claim 3,
wherein the PCB further includes a second via hole disposed between the fifteenth layer and the sixteenth layer,
wherein an end of the second via hole is electrically connected with another end of the coaxial feedline, and
wherein another end of the second via hole is electrically connected with the RFIC module.

5. The base station of claim 1, wherein the PCB further includes a third via hole disposed between the second layer and the third layer.

6. The base station of claim 5, wherein the PCB further includes a fourth via hole disposed between the third layer and the fourth layer.

7. The base station of claim 6,
wherein an end of the third via hole is electrically connected with the first layer,
wherein another end of the third via hole is electrically connected with an end the fourth via hole, and
wherein another end of the fourth via hole is electrically connected with the fourth layer.

8. The base station of claim 1, wherein the PCB further includes a fifth via hole disposed between the thirteenth layer and the fourteenth layer.

9. The base station of claim 8, wherein the PCB further includes a sixth via hole disposed between the fourteenth layer and the fifteenth layer.

10. The base station of claim 9,
wherein an end of the fifth via hole is electrically connected with the fourteenth layer,
wherein another end of the fifth via hole is electrically connected with an end the sixth via hole, and
wherein another end of the sixth via hole is electrically connected with the fifteenth layer.

11. An electronic apparatus A base station comprising:
a printed circuit board (PCB) including a plurality of layers, the plurality of layers including a first layer to a sixteenth layer;
an antenna module mounted on a surface of the PCB; and
a radio frequency integrated circuit (RFIC) mounted on another surface of the PCB,
wherein the PCB includes a coaxial plated through-hole (PTH) electrically connected with the antenna module and the RFIC,
wherein the coaxial PTH includes a coaxial feedline and a plated region,
wherein the coaxial feedline is formed through layers starting from a second layer to a fifteenth layer,
wherein the plated region is formed through layers starting from a third layer to a fourteenth layer and surrounds the coaxial feedline,
wherein a diameter of the coaxial PTH is 0.7 to 1 mm,
wherein a diameter of the coaxial feedline is 0.15 to 0.2 mm,
wherein a fourth to a thirteenth layers are made of a Flame Retardant type-4 (FR-4) material, and
wherein the first to the third layers and the fourteenth to the sixteenth layers are made of a material having a dissipation factor lower than a dissipation factor of the FR-4 material.

12. An electronic apparatus A base station comprising:
a printed circuit board (PCB) including a plurality of layers, the plurality of layers including a first layer to a sixteenth layer;
an antenna module mounted on a surface of the PCB; and
a system-in-package (SiP) module including a plurality of radio frequency integrated circuits (RFIC) mounted on another surface of the printed circuit board,
wherein the PCB includes a coaxial plated through-hole (PTH) electrically connected with the antenna module and the SiP module,
wherein the coaxial PTH includes a coaxial feedline and a plated region,
wherein the coaxial feedline is formed through layers starting from a second layer to a fifteenth layer,
wherein the plated region is formed through layers starting from a third layer to a fourteenth layer and surrounds the coaxial feedline,
wherein a diameter of the coaxial PTH is 0.7 to 1 mm,
wherein a diameter of the coaxial feedline is 0.15 to 0.2 mm,
wherein a fourth to a thirteenth layers are made of a Flame Retardant type-4 (FR-4) material, and
wherein the first to the third layers and the fourteenth to the sixteenth layers are made of a material having a dissipation factor lower than a dissipation factor of the FR-4 material.

\* \* \* \* \*